(12) United States Patent
Araki

(10) Patent No.: US 9,539,589 B2
(45) Date of Patent: Jan. 10, 2017

(54) SUBSTRATE PROCESSING APPARATUS, AND NOZZLE

(71) Applicant: SCREEN Holdings Co., Ltd., Kyoto (JP)

(72) Inventor: Hiroyuki Araki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/699,757

(22) Filed: Apr. 29, 2015

(65) Prior Publication Data

US 2015/0246365 A1 Sep. 3, 2015

Related U.S. Application Data

(62) Division of application No. 13/527,803, filed on Jun. 20, 2012, now abandoned.

(30) Foreign Application Priority Data

Aug. 30, 2011 (JP) .................................. 2011-187687
Sep. 29, 2011 (JP) .................................. 2011-214935

(51) Int. Cl.
| | | |
|---|---|---|
| B05B 1/02 | (2006.01) | |
| B05B 17/06 | (2006.01) | |
| B05C 11/08 | (2006.01) | |
| B05B 3/02 | (2006.01) | |
| B05B 13/02 | (2006.01) | |
| H01L 21/67 | (2006.01) | |

(52) U.S. Cl.
CPC . *B05B 1/02* (2013.01); *B05B 3/02* (2013.01); *B05B 17/0607* (2013.01); *B05C 11/08* (2013.01); *B05B 13/0228* (2013.01); *H01L 21/6715* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 5,571,560 A | 11/1996 | Lin | 427/240 |
| 5,695,817 A | 12/1997 | Tateyama et al. | 427/240 |
| 6,488,779 B1 | 12/2002 | Lohmüller | 134/6 |
| 6,551,765 B1 | 4/2003 | Mukai et al. | 430/320 |
| 6,634,805 B1 | 10/2003 | Templeton et al. | 396/571 |
| 6,635,113 B2 | 10/2003 | Takamori et al. | 118/681 |

(Continued)

FOREIGN PATENT DOCUMENTS

| | | |
|---|---|---|
| EP | 1 076 356 B1 | 2/2001 |
| JP | 2002-540939 A | 12/2002 |

(Continued)

*Primary Examiner* — Charles Capozzi
(74) *Attorney, Agent, or Firm* — Ostrolenk Faber LLP

(57) ABSTRACT

A substrate processing apparatus includes a substrate holding unit, an injection unit that injects droplets of a processing liquid from a plurality of injection ports respectively toward a plurality of collision positions on the substrate, and a liquid film forming unit. The liquid film forming unit discharges a protective liquid from a plurality of discharge ports toward a plurality of liquid contact positions that respectively cover different collision positions. The plurality of injection ports and the plurality of discharge ports may be formed in a nozzle. A nozzle moving unit may be provided, to move the nozzle along the substrate.

9 Claims, 13 Drawing Sheets

(56) References Cited

U.S. PATENT DOCUMENTS

| | | | |
|---|---|---|---|
| 7,644,512 B1 | 1/2010 | Liu et al. | 34/413 |
| 2002/0152924 A1 | 10/2002 | Dorian et al. | 105/404 |
| 2002/0152954 A1* | 10/2002 | Takamori | H01L 21/6715 118/52 |
| 2003/0084925 A1 | 5/2003 | Nakajima et al. | 134/26 |
| 2004/0060906 A1* | 4/2004 | Bachrach | H01L 21/6708 216/92 |
| 2004/0084144 A1* | 5/2004 | Yokouchi | H01L 21/67051 156/345.11 |
| 2004/0182422 A1* | 9/2004 | Boyd | G03F 7/70341 134/18 |
| 2005/0115596 A1 | 6/2005 | Nakajima et al. | 134/94.1 |
| 2009/0079948 A1 | 3/2009 | Kitano et al. | 355/27 |

FOREIGN PATENT DOCUMENTS

| | | |
|---|---|---|
| JP | 2003-209087 A | 7/2003 |
| JP | 2004-79908 | 3/2004 |
| JP | 2006-086415 A | 3/2006 |
| JP | 2007-196094 | 8/2007 |
| JP | 2008-108830 A | 5/2008 |
| JP | 2011-29315 | 2/2011 |
| KR | 10-2010-0054559 A | 5/2010 |
| TW | 285779 B | 9/1996 |
| TW | 425618 B | 3/2001 |
| TW | 451354 B | 8/2001 |
| TW | 478973 B | 3/2002 |

\* cited by examiner

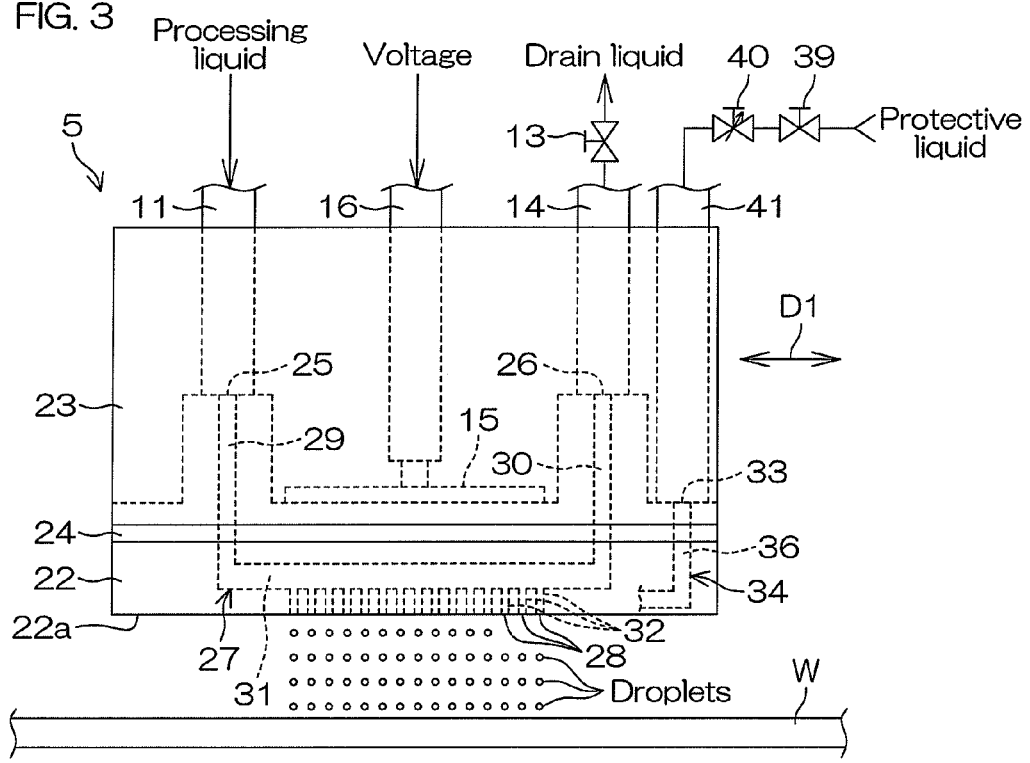
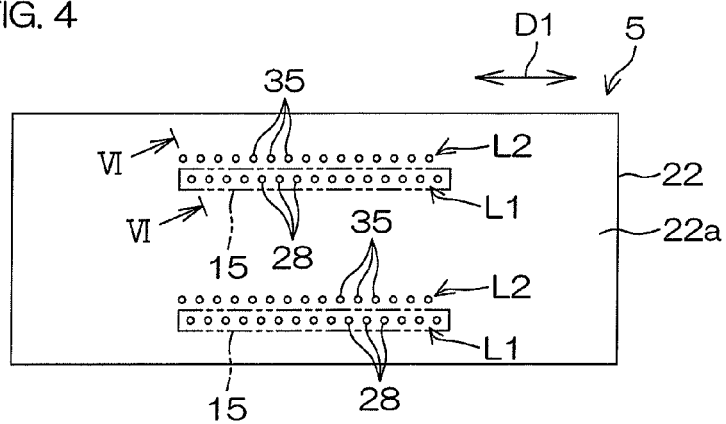

FIG. 8A First covering process
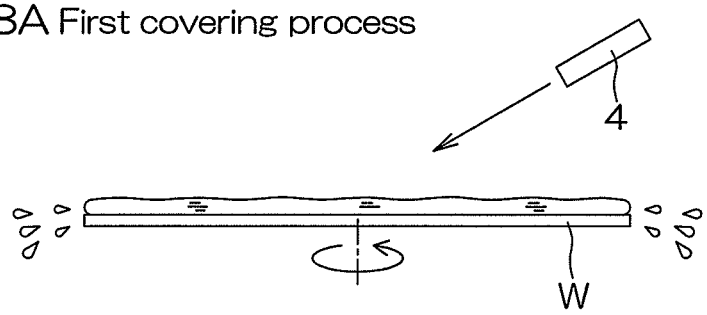
FIG. 8B Cleaning process and second covering process
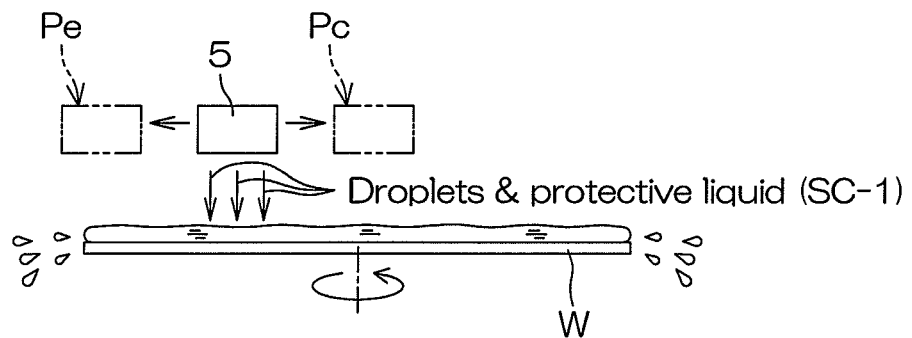
FIG. 8C Rinsing process
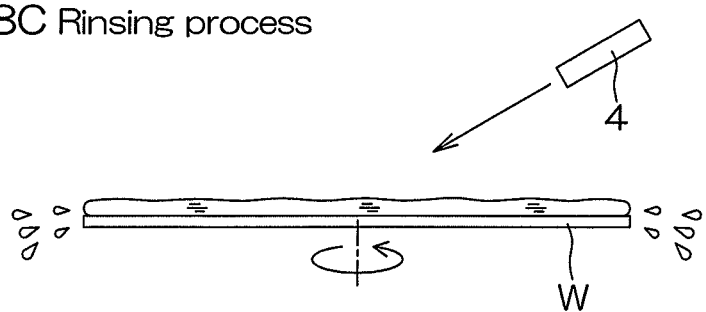
FIG. 8D Drying process
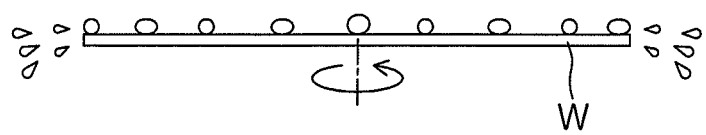

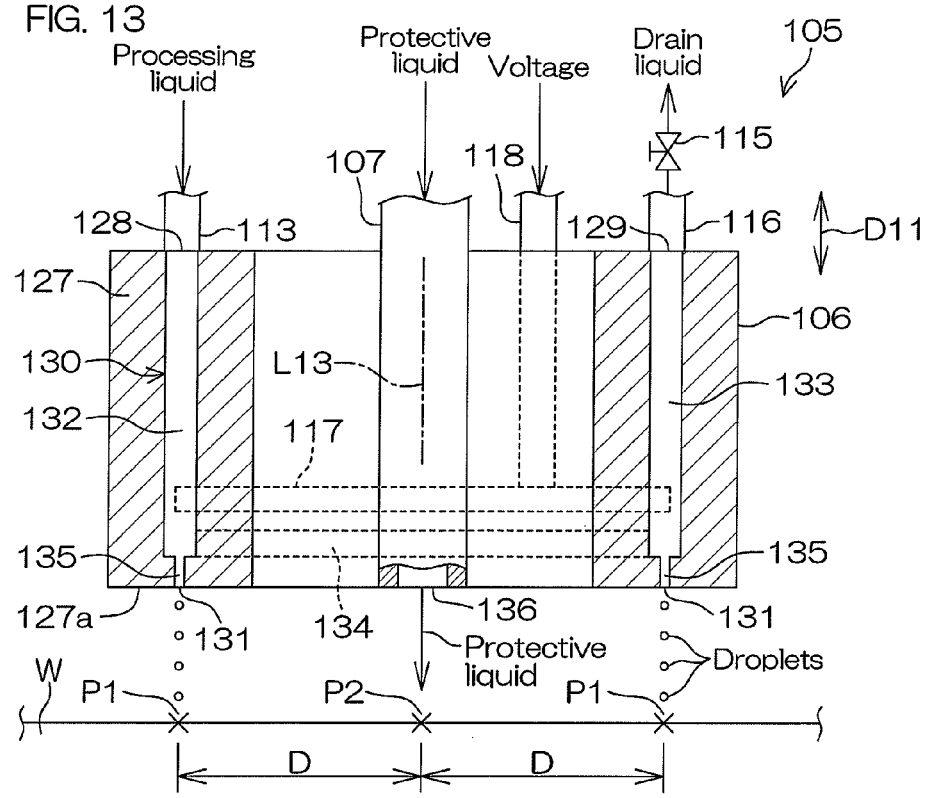
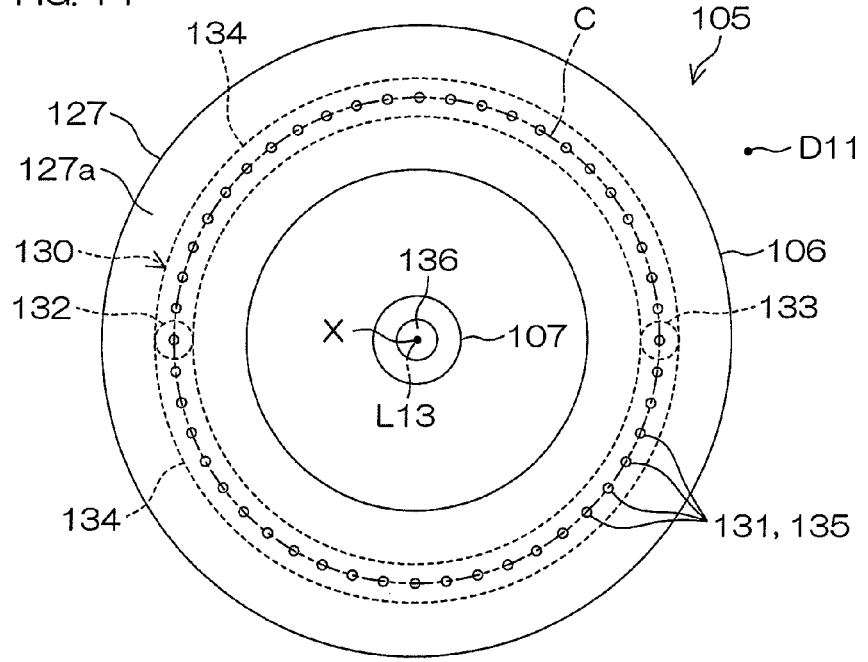

FIG. 15A First covering process
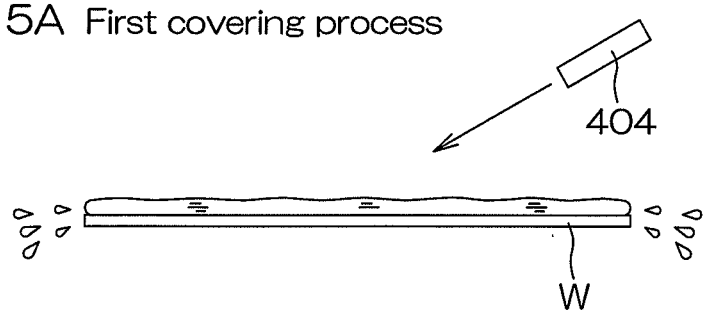
FIG. 15B Cleaning process and second covering process
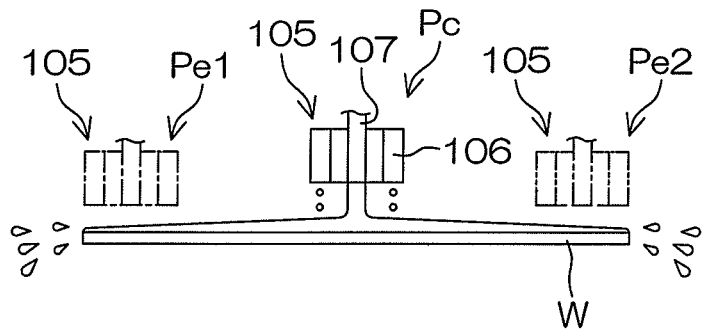
FIG. 15C Rinsing process
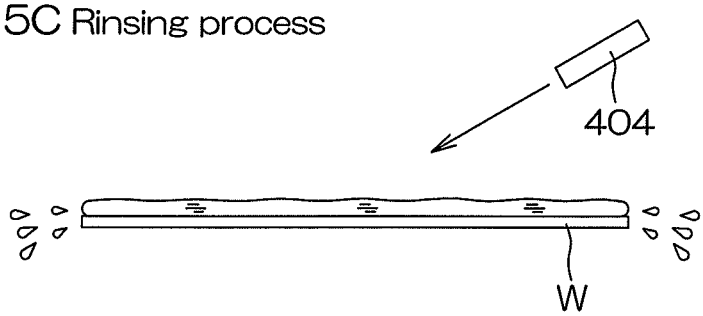
FIG. 15D Drying process
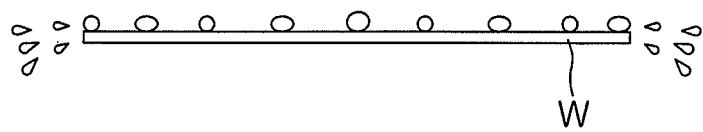

SUBSTRATE PROCESSING APPARATUS, AND NOZZLE

CROSS-REFERENCE TO RELATED APPLICATIONS

This application is a divisional of prior U.S. patent application Ser. No. 13/527,803, filed Jun. 20, 2012, by Tadashi Maegawa and Hiroyuki Araki entitled SUBSTRATE PROCESSING APPARATUS, SUBSTRATE PROCESSING METHOD, AND NOZZLE, which claims the benefit of Japanese Patent Application No. 2011-187687, filed Aug. 30, 2011 and Japanese Patent Application No. 2011-214935, filed Sep. 29, 2011, the contents of all of which are incorporated herein by reference.

BACKGROUND OF THE INVENTION

1. Field of the Invention

The present invention relates to a substrate processing apparatus and a substrate processing method for processing a substrate, and a nozzle that makes droplets collide with a substrate covered by a liquid film. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

2. Description of Related Art

In a manufacturing process for a semiconductor device or a liquid crystal display, etc., a substrate processing apparatus is used to process substrates, such as semiconductor wafers, glass substrates for liquid crystal displays. A substrate processing apparatus described in Japanese Unexamined Patent Application Publication No. 2011-29315 includes a spin chuck holding a substrate horizontally, a head injecting droplets of a processing liquid toward an upper surface of the substrate from a plurality of discharge holes, and a cover rinse nozzle supplying a cover rinse liquid to the upper surface of the substrate.

The head injects droplets of the processing liquid toward a plurality of collision positions within the upper surface of the substrate. Likewise, the cover rinse liquid nozzle discharges the cover rinse liquid toward a liquid contact position within the upper surface of the substrate. The cover rinse liquid discharged from the cover rinse liquid nozzle spreads along the substrate from the liquid contact position toward the plurality of collision positions. A liquid film of the cover rinse liquid is thereby formed on the substrate and the plurality of collision positions are covered by the liquid film of the cover rinse liquid. The droplets of the processing liquid are injected toward the upper surface of the substrate that is covered by the liquid film of the cover rinse liquid.

A thickness of the liquid film of the cover rinse liquid formed on the substrate decreases with increasing distance from the liquid contact position. With the substrate processing apparatus described in Japanese Unexamined Patent Application Publication No. 2011-29315, distances between the respective collision positions and the liquid contact position are not fixed and variation of liquid film thickness occurs among the respective collision positions. Further, the cover rinse liquid flowing to a collision position at a downstream side with respect to a direction of flow of the cover rinse liquid along the substrate is impeded in its progress by droplets injected onto a collision position at an upstream side, and thus a supply flow rate of the cover rinse liquid differs between the upstream side collision position and the downstream side collision position, thereby further increasing the variation of liquid film thickness. Thus, with the substrate processing apparatus described in Japanese Unexamined Patent Application Publication No. 2011-29315, it is difficult to control the liquid film thicknesses at the respective collision positions to be of a fixed magnitude.

When the liquid film covering the collision positions is thin, a large impact is applied to the substrate by collisions of the droplets and a pattern formed on the substrate may become damaged. To prevent damage, increase of discharge flow rate of the cover rinse liquid from the cover rinse nozzle to increase the liquid film thickness at the respective collision positions may be considered. However, if the liquid film covering the collision positions is thick, impacts applied to particles attached to the substrate decrease and a decrease of particle removal rate may thus occur. There is thus an optimal value of the thickness of the liquid film that covers the collision positions.

As mentioned above, it is difficult to control the liquid film thicknesses at the respective collision positions to be of a fixed magnitude with the substrate processing apparatus described in Japanese Unexamined Patent Application Publication No. 2011-29315, and it is thus difficult to form a liquid film of the optimal thickness at all collision positions. It is thus difficult to perform optimal processing at the respective collision positions.

Also, with the substrate processing apparatus described in Japanese Unexamined Patent Application Publication No. 2011-29315, variation of film thickness (thickness of the liquid film of the cover rinse liquid) occurs among the respective collision positions because the distances between the respective collision positions and the liquid contact position are not fixed. Variation thus occurs in the impact applied to the substrate by the collision of the droplets. Specifically, a large impact may be applied at a certain position within the substrate while a small impact is applied to another position within the substrate. A region in which pattern collapse occurs and a region in which foreign matter is not adequately removed may thus form within the same substrate, and uniformity of processing may thus be lowered.

SUMMARY OF THE INVENTION

A preferred embodiment of the present invention provides a substrate processing apparatus and a substrate processing method that enable reduction of variation of film thickness among respective positions of a substrate at which droplets collide and enable improvement of processing quality of the substrate.

A substrate processing apparatus according to a preferred embodiment of the present invention includes a substrate holding unit that holds a substrate, an injection unit that injects droplets of a processing liquid from a plurality of injection ports respectively toward a plurality of collision positions within a principal surface of the substrate held by the substrate holding unit, and a liquid film forming unit that discharges a protective liquid from a plurality of discharge ports respectively toward a plurality of liquid contact positions within the principal surface of the substrate held by the substrate holding unit to form a plurality of liquid films of a protective liquid that respectively cover different collision positions. The principal surface of the substrate may be a top surface which is a device forming surface, or may be a rear surface opposite to the top surface.

With this arrangement, droplets of the processing liquid are injected from the plurality of injection ports toward the plurality of collision positions within the principal surface of the substrate held by the substrate holding unit. In parallel therewith, the protective liquid is discharged from the plurality of discharge ports respectively to the plurality of liquid contact positions within the principal surface of the substrate. The droplets of the processing liquid are thus injected toward the principal surface of the substrate that is protected by the protective liquid. The plurality of liquid films of the protective liquid respectively covering the plurality of regions within the principal surface of the substrate are formed because the protective liquid is discharged from the plurality of discharge ports respectively toward the plurality of liquid contact positions. The plurality of liquid films respectively cover different collision positions. The processing liquid at the respective collision positions can thus be supplied more uniformly than in a case where all collision positions are covered by a single liquid film. Variation of film thickness of the protective liquid among the respective collision positions can thus be reduced. The thickness of the liquid film at each collision position can thus be made to approach an optimal value and a processing quality of the substrate can be improved.

The liquid film forming unit may form the plurality of liquid films so that the plurality of liquid films do not overlap on the substrate held by the substrate holding unit, that is, so that the plurality of liquid films are spaced apart on the substrate. Also, the liquid film forming unit may form the plurality of liquid films so that the plurality of liquid films overlap partially on the substrate held by the substrate holding unit. In this case, the liquid film forming unit preferably forms the plurality of liquid films so that each collision position is covered by a non-interfering portion of a liquid film that is not interfering with another liquid film.

Also, preferably with the substrate processing apparatus according to the preferred embodiment of the present invention, the injection unit includes a processing liquid supplying unit that supplies the processing liquid to the plurality of injection ports and a vibration applying unit that applies vibration to the processing liquid injected from the plurality of injection ports to sever the processing liquid injected from the plurality of injection ports.

With this arrangement, droplets of the processing liquid are injected from the respective injection ports by the processing liquid, supplied to the plurality of injection ports from the processing liquid supplying unit, being severed by vibration from the vibration applying unit. Variations of size (particle diameter) and speed of the droplets can be reduced more than with a two-fluid nozzle that forms droplets by collision of a liquid and a gas because the droplets are formed by the vibration from the vibration applying unit. The variation of film thickness among the respective collision positions can thus be reduced, and additionally, variation of kinetic energy of the droplets can be reduced. Impacts applied to the substrate due to collision of the droplets can thus be stabilized at each collision position to enable improvement of the substrate processing quality.

The substrate processing apparatus according to the preferred embodiment of the present invention may further include a nozzle in which the plurality of injection ports and the plurality of discharge ports are formed.

With this arrangement, the injection ports and the discharge ports are formed in a member (nozzle) in common. That is, the nozzle is shared by the injection unit and the liquid film forming unit. A number of parts can thus be reduced in comparison to a case where the injection ports and the discharge ports are formed respectively in different members. Further, change of a positional relationship between the injection ports and the discharge ports (positions of the injection ports and the discharge ports with respect to a certain reference point) can be prevented and the positions at which the liquid films of the protective liquid are formed can thus be prevented from moving with respect to the collision positions. The collision positions can thus be covered reliably by the liquid films of the protective liquid. Further, maintenance work for adjusting the positional relationship of the injection ports and the discharge ports is made unnecessary because change of the positional relationship can be prevented.

A size of the nozzle when viewed from a direction perpendicular to the substrate held by the substrate holding unit may be equal to that of the substrate, or may be greater than that of the substrate, or may be less than that of the substrate. Also, the injection ports and the discharge ports may be disposed at the same height or may be disposed at different heights. Also, the injection ports and the discharge ports may be opened in a planar surface in common. In this case, the planar surface may be a facing surface of the nozzle that faces the principal surface of the substrate held by the substrate holding unit.

The substrate processing apparatus according to the preferred embodiment of the present invention may further include a nozzle moving unit that moves the nozzle along the principal surface of the substrate held by the substrate holding unit.

With this arrangement, the plurality of collision positions can be moved within the principal surface of the substrate by moving the nozzle by means of the nozzle moving unit. The principal surface of the substrate can thereby be scanned as the plurality of collision positions move along. Droplets of the processing liquid can thereby be made to collide with the entire principal surface of the substrate to clean the principal surface of the substrate uniformly. Further, the injection ports and the discharge ports are formed in the member in common (nozzle) and thus even when the nozzle moving unit moves the nozzle, the positional relationship of the injection ports and the discharge ports does not change. Droplets of the processing liquid can thus be injected toward the collision positions while reliably protecting the collision positions by the liquid film of the protective liquid.

Also, preferably, the substrate processing apparatus according to the preferred embodiment of the present invention further includes a substrate rotating unit that rotates the substrate in a substrate rotation direction around a rotation axis intersecting the principal surface of the substrate held by the substrate holding unit, and the liquid contact positions are set further to the rotation axis side than the collision positions and further upstream than the collision positions with respect to the substrate rotation direction.

With this arrangement, the substrate rotating unit rotates the substrate in the substrate rotation direction around the rotation axis intersecting the principal surface of the substrate. A liquid on the substrate in a rotating state moves toward a downstream side of the substrate rotation direction while moving in a direction away from the rotation axis. The liquid contact positions of the protective liquid are set further to the rotation axis side than the collision positions of the droplets and further upstream than the collision positions with respect to the substrate rotation direction. The protective liquid supplied to the substrate in the rotating state thus spreads from the liquid contact positions toward the collision positions. The protective liquid is thus supplied reliably to the collision positions and the collision positions are reliably covered by the liquid film of the protective liquid. Droplets of the processing liquid can thus be injected toward the collision positions while reliably protecting the collision positions by the liquid film of the protective liquid.

Preferably, in the substrate processing apparatus according to the preferred embodiment of the present invention, each collision position is set on an extension line extending in a direction of a resultant force acting on the protective liquid on the liquid contact position in accordance with the rotation of the substrate by the substrate rotating unit.

A centrifugal force that is directed outward (in a direction away from the rotation axis) and a Coriolis force in a direction orthogonal to a movement direction of a liquid act on the liquid on the substrate in the rotating state. The liquid on the substrate in the rotating state mainly moves in a direction of the resultant force of these two forces. Each collision position is set on an extension line extending in the direction of the resultant force. The protective liquid supplied to the liquid contact positions thus mainly flows toward the collision positions and is supplied to the collision positions efficiently. The liquid films of predetermined thickness can thus be formed while reducing a discharge flow rate of the protective liquid. The protective liquid can thereby be reduced in consumption amount.

Also, in the substrate processing apparatus according to the preferred embodiment of the present invention, the plurality of liquid contact positions may correspond respectively to the plurality of collision positions, and the liquid film forming unit may be arranged to discharge the protective liquid from the plurality of discharge ports respectively toward the plurality of liquid contact positions to form the plurality of liquid films of the protective liquid respectively covering the plurality of collision positions.

With this arrangement, the plurality of discharge ports corresponding respectively to the plurality of injection ports are provided and the plurality of liquid contact positions correspond respectively to the plurality of collision positions. When the protective liquid is discharged from the plurality of discharge ports, the plurality of liquid films respectively covering the plurality of collision positions are formed. The plurality of liquid films are formed respectively by the protective liquid discharged from the plurality of discharge ports. That is, a single liquid film is formed per single collision position and the collision position is covered by this liquid film. The liquid film thickness at each collision position can thus be controlled with better precision than in a case where a plurality of collision positions are covered by a single liquid film. Variation of the liquid film thickness among the respective collision positions can thereby be reduced further.

With the substrate processing apparatus according to the preferred embodiment of the present invention, each liquid contact position may correspond to a plurality of the collision positions, and the plurality of collision positions corresponding to a liquid contact position in common may be set along a circular arc centered at the liquid contact position in common. With this arrangement, a single liquid contact position corresponds to a plurality of collision positions and the plurality of collision positions are covered by the protective liquid supplied to the liquid contact position in common. The thickness of a liquid film of the protective liquid decreases with distance away from the liquid contact position. Put in another way, if the distance from the liquid contact position is fixed, the liquid film thickness at the corresponding position is substantially fixed. The plurality of collision positions corresponding to the liquid contact position in common are set along the circular arc centered at the liquid contact position in common. Variation of the liquid film thickness among these collision positions can thus be reduced further.

The substrate processing apparatus according to the preferred embodiment of the present invention may further include a substrate rotating unit that rotates the substrate in a substrate rotation direction around a rotation axis intersecting the principal surface of the substrate held by the substrate holding unit. In this case, each liquid contact position may correspond to a plurality of the collision positions, and the plurality of collision positions corresponding to a liquid contact position in common may be set along an extension line extending in a direction of a resultant force acting on the protective liquid on the liquid contact position in accordance with the rotation of the substrate by the substrate rotating unit and set so as not to overlap when viewed from the direction of the resultant force.

With the present arrangement, a single liquid contact position corresponds to a plurality of collision positions and the plurality of collision positions are covered by the protective liquid supplied to the liquid contact position in common. The plurality of collision positions corresponding to the liquid contact position in common are set along the extension line extending along the resultant force (resultant force of the centrifugal force and the Coriolis force) that acts on the protective liquid on the liquid contact position in accordance with the rotation of the substrate by the substrate rotating unit. The protective liquid is thus supplied efficiently to the plurality of collision positions corresponding to the liquid contact position in common. Further, the plurality of collision positions corresponding to the liquid contact position in common are set so as not to overlap when viewed from the direction of the resultant force. Blocking of the protective liquid, to be supplied to a collision position at a downstream side with respect to the direction of the resultant force, by the droplets of the processing liquid injected toward a collision position at an upstream side can thus be suppressed or prevented. The protective liquid can thereby be supplied reliably to the respective collision positions.

Also, a substrate processing method according to a preferred embodiment of the present invention includes an injecting step of injecting droplets of a processing liquid from a plurality of injection ports respectively toward a plurality of collision positions within a principal surface of a substrate, and a liquid film forming step of forming a plurality of liquid films of a protective liquid that respectively cover different collision positions by discharging the protective liquid from a plurality of discharge ports respectively toward a plurality of liquid contact positions within the principal surface of the substrate in parallel with performing the injecting step.

Preferably with the substrate processing method according to the preferred embodiment of the present invention, the injecting step includes a processing liquid supplying step of supplying the processing liquid to the plurality of injection ports and a vibration applying step of severing the processing liquid injected from the plurality of injection ports by applying vibration to the processing liquid injected from the plurality of injection ports in parallel to performing the processing liquid supplying step.

A nozzle according to a preferred embodiment according to another aspect of the present invention makes droplets injected from a plurality of injection ports collide with a substrate covered by a liquid film of a protective liquid discharged from a discharge port, and the nozzle includes an injection portion in which the plurality of injection ports are formed so that the droplets injected from the plurality of injection ports collide respectively with a plurality of collision positions within the substrate, and a discharge portion in which the discharge port is formed so that the protective liquid contacts a liquid contact position within the substrate that is equal in distance from the respective collision positions.

With this arrangement, the liquid film of the protective liquid that covers the substrate is formed by the protective liquid being discharged from the discharge port formed in the discharge portion. By the droplets being injected from the injection portion in which the plurality of injection ports are formed, the droplets collide with the substrate covered by the liquid film of the protective liquid. The droplets injected from the respective injection ports collide with the collision positions within the substrate that are equal in distance from the liquid contact position within the substrate at which the protective liquid makes contact. The thickness of the liquid film on the substrate changes in accordance with distance from the liquid contact position. Thus, by making the distances from the respective collision positions to the liquid contact position equal, variation of the film thickness (thickness of the liquid film of the protective liquid) among the respective collision positions can be reduced. Variation of impact applied to the substrate among the respective collision positions can thus be reduced. Uniformity of processing can thereby be improved.

Preferably, the nozzle according to the preferred embodiment of the present invention further includes a supplying portion in which a processing liquid flow passageway supplying the processing liquid to the plurality of injection ports is formed and a vibration applying unit severing the processing liquid supplied to the plurality of injection ports by applying vibration to the processing liquid flowing through the processing liquid flow passageway.

With this arrangement, the processing liquid supplied to the plurality of injection ports from the processing liquid flow passageway is severed by the vibration from the vibration applying unit. A liquid column of the processing liquid, having a diameter substantially equal to a diameter of each injection port, is thereby injected from the injection port. The liquid column changes to a spherical shape due to surface tension and becomes a spherical droplet. For example, in a case of forming a plurality of droplets by making a liquid and a gas collide, the diameter and speed of the droplets are not uniform and vary greatly. Thus, in comparison to the case of forming a plurality of droplets by making a liquid and a gas collide, droplets that are more uniform in particle diameter and speed can be formed. Variation of kinetic energy of the droplets can thus be reduced in addition to being able to reduce the variation of film thickness among the respective collision positions. Variation of impact applied to the substrate by the collision of the droplets can thereby be reduced. The uniformity of processing can thereby be improved further.

With the nozzle according to the preferred embodiment of the present invention, distances (for example, minimum distances) from the respective injection ports to the discharge port may be equal.

With this arrangement, the distances from the respective injection ports to the discharge port are equal and thus the respective droplets collide with positions (collision positions) within the substrate that are equal in distance from the liquid contact position. Variation of the liquid film thickness among the respective collision positions can thus be reduced. The uniformity of processing can thereby be improved.

The plurality of injection ports may include a plurality of annularly aligned injection ports disposed at positions of equal distance from a reference point when viewed from a reference direction. In this case, the plurality of annularly aligned injection ports may be disposed on the same plane or may be disposed on different planes. That is, as long as the distances from the reference point to the respective annularly aligned injection ports are equal when viewed from the reference direction, the plurality of annularly aligned injection ports may be disposed on the same plane or may be disposed on different planes.

In the case where the plurality of injection ports include the plurality of annularly aligned injection ports, the discharge port may include a central discharge port disposed so as to be positioned at the reference point when viewed from the reference direction. In this case, the distances from the respective annularly aligned injection ports to the discharge port when viewed from the reference direction are equal and thus the respective droplets collide with positions (collision positions) within the substrate that are equal in distance from the liquid contact position. Variation of the film thickness among the respective collision positions can thus be reduced. The uniformity of processing can thereby be improved.

Also, in the case where the plurality of injection ports include the plurality of annularly aligned injection ports, the discharge port may include an annular discharge port that is continuous along a whole circumference and surrounds the reference point coaxially when viewed from the reference direction. The annular discharge port may include an inner annular discharge port that is continuous along the whole circumference and surrounds the reference point coaxially at an inner side of the plurality of annularly aligned injection ports when viewed from the reference direction or may include an outer annular discharge port that is continuous along the whole circumference and surrounds the reference point coaxially at an outer side of the plurality of annularly aligned injection ports when viewed from the reference direction. In either case, the minimum distances from the respective annularly aligned injection ports to the annular discharge port when viewed from the reference direction are equal and thus the respective droplets collide with positions (collision positions) within the substrate that are equal in distance from the liquid contact position. Variation of the liquid film thickness among the respective collision positions can thus be reduced. The uniformity of processing can thereby be improved. The plurality of annularly aligned injection ports do not have to surround the discharge port across the whole circumference, and in this case, the corresponding annular discharge port may be arcuate.

Also, the plurality of injection ports may include a plurality of rectilinearly aligned injection ports disposed so as to be aligned rectilinearly when viewed from a reference direction. In this case, as in the annularly aligned injection ports, the plurality of rectilinearly aligned injection ports may be disposed on the same plane or may be disposed on different planes.

In the case where the plurality of injection ports include the plurality of rectilinearly aligned injection ports, the discharge port may include a slit-shaped rectilinear discharge port parallel to the plurality of rectilinearly aligned injection ports when viewed from the reference direction. In this case, the minimum distances from the respective rectilinearly aligned injection ports to the rectilinear discharge port when viewed from the reference direction are equal and thus the respective droplets collide with positions (collision positions) within the substrate that are equal in distance from the liquid contact position. Variation of the liquid film thickness among the respective collision positions can thus be reduced. The uniformity of processing can thereby be improved.

A substrate processing apparatus according to yet another preferred embodiment of the present invention includes the nozzle described above, a processing liquid supply pipe that supplies the processing liquid to the injection portion, a protective liquid supply pipe that supplies the protective liquid to the discharge portion, a substrate holding unit that holds a substrate, and a relative movement unit that makes the nozzle and the substrate held by the substrate holding unit move relatively by moving at least one of either the nozzle or the substrate in a state where a positional relationship of the plurality of injection ports and the discharge port is kept fixed.

With this arrangement, the liquid film of the protective liquid that covers the substrate held by the substrate holding unit is formed by the protective liquid, supplied from the protective liquid supply pipe to the discharge portion, being discharged from the discharge port. A plurality of droplets are made to collide with the substrate, covered by the liquid film of the protective liquid, by the processing liquid, supplied from the processing liquid supply pipe to the processing portion, being injected from the plurality of injection ports. The relative movement unit makes the nozzle and the substrate held by the substrate holding unit move relatively by moving at least one of either the nozzle or the substrate. The substrate is thereby scanned by the droplets of the processing liquid and the plurality of droplets collide with a wide range of the substrate. A wide range of the substrate is thus cleaned. Further, the relative movement unit makes the nozzle and the substrate move relatively in the state where the positional relationship of the plurality of injection ports and the discharge port is kept fixed. Variation of impact applied to the substrate among the respective collision positions can thereby be reduced. The uniformity of processing can thereby be improved.

The relative movement unit may be a substrate moving unit that moves the substrate, or a nozzle moving unit that moves the nozzle, or a substrate and nozzle moving unit that moves the substrate and the nozzle.

The substrate processing apparatus according to the preferred embodiment of the present invention may further include a substrate rotating unit that rotates the substrate around a rotation axis intersecting a central portion of a principal surface of the substrate held by the substrate holding unit, and the relative movement unit may move the nozzle between a central position at which the nozzle faces the central portion of the principal surface of the substrate and a peripheral edge position at which the nozzle faces a peripheral edge portion of the principal surface of the substrate in a manner such that a distance between the nozzle and the substrate at the central position is shorter than a distance between the nozzle and the substrate at the peripheral edge position. The principal surface of the substrate may be a top surface of the substrate, which is a device forming surface, or may be a rear surface opposite to the top surface.

With the present arrangement, the relative moving unit moves the nozzle between the central position at which the nozzle faces the central portion of the principal surface of the substrate and the peripheral edge position at which the nozzle faces the peripheral edge portion of the principal surface of the substrate while the substrate rotating unit rotates the substrate around the rotation axis intersecting the central portion of the principal surface of the substrate. The entire principal surface of the substrate is thereby scanned by the droplets of the processing liquid and the plurality of droplets collide with the entire principal surface of the substrate. The cleanness of the substrate is thereby increased. Further, the distance between the nozzle and the substrate at the peripheral edge position is shorter than the distance between the nozzle and the substrate at the central position, and thus an impact applied to the central portion of the principal surface of the substrate is weaker than an impact applied to the peripheral edge portion of the principal surface of the substrate. The central portion of the principal surface of the substrate is smaller in area than the peripheral edge portion of the principal surface of the substrate and thus droplets are supplied at a higher density than at the peripheral edge portion of the principal surface of the substrate. Thus, by lowering the impact applied to the central portion of the principal surface of the substrate, a difference between a total amount of the impact applied to the central portion of the principal surface of the substrate and a total amount of the impact applied to the peripheral edge portion of the principal surface of the substrate can be reduced. The uniformity of processing can thereby be improved.

The above and yet other objects, characteristics, and effects of the present invention shall be made clear by the following description of preferred embodiments with reference to the attached drawings.

BRIEF DESCRIPTION OF THE DRAWINGS

FIG. 3 is a schematic side view of the nozzle according to the first preferred embodiment of the present invention.

FIG. 4 is a schematic plan view of the nozzle according to the first preferred embodiment of the present invention.

FIG. 8A to FIG. 8D are diagrams for describing an example of processing of a substrate performed by the substrate processing apparatus according to the first preferred embodiment of the present invention.

FIG. 13 is a schematic longitudinal sectional view of the cleaning nozzle according to the fourth preferred embodiment of the present invention.

FIG. 14 is a schematic bottom view of the cleaning nozzle according to the fourth preferred embodiment of the present invention.

FIG. 15A to FIG. 15D are diagrams for describing an example of processing of a substrate performed by the substrate processing apparatus according to the fourth preferred embodiment of the present invention.

DETAILED DESCRIPTION OF THE PREFERRED EMBODIMENTS

Figure 1:
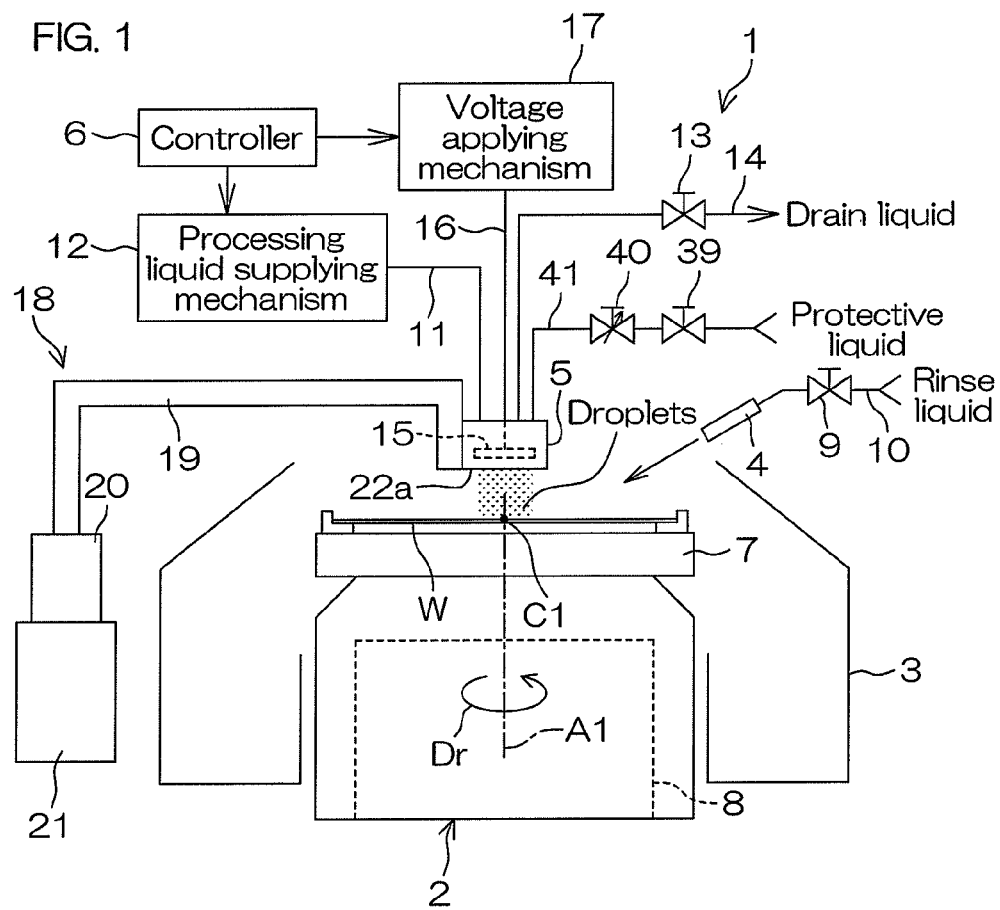
FIG. 1 is a schematic view of a general arrangement of a substrate processing apparatus according to a first preferred embodiment of the present invention.
Figure 2:
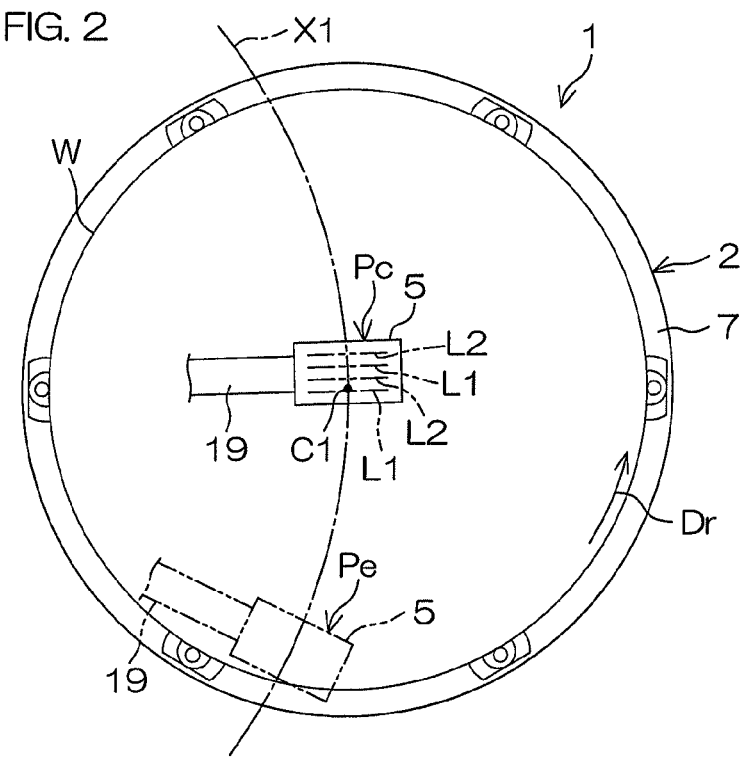
FIG. 2 is a plan view of a nozzle and an arrangement related thereto according to the first preferred embodiment of the present invention.

FIG. 1 is a schematic view of a general arrangement of a substrate processing apparatus 1 according to a first preferred embodiment of the present invention. FIG. 2 is a plan view of an injection nozzle 5 and an arrangement related thereto according to the first preferred embodiment of the present invention.

The substrate processing apparatus 1 is a one-by-one type substrate processing apparatus that processes a semiconductor wafer or other circular substrate W one at a time. As shown in FIG. 1, the substrate processing apparatus 1 includes a spin chuck 2 (substrate holding unit, substrate rotating unit) that horizontally holds and rotates the substrate W, a tubular cup 3 surrounding the spin chuck 2, a rinse liquid nozzle 4 supplying a rinse liquid to the substrate W, an injection nozzle 5 (injection unit, liquid film forming unit) making droplets of a processing liquid collide with the substrate W, and a controller 6 controlling operations of the spin chuck 2 and other apparatuses and opening/closing of valves provided in the substrate processing apparatus 1.

As shown in FIG. 1, the spin chuck 2 includes a spin base 7 holding the substrate W horizontally and being rotatable around a vertical rotation axis A1 passing through a center C1 of the substrate W, and a spin motor 8 rotating the spin base 7 in a substrate rotation direction Dr around the rotation axis A1. The spin chuck 2 may be a clamping type chuck that holds the substrate W horizontally by clamping the substrate W in a horizontal direction or may be a vacuum type chuck that holds the substrate W horizontally by suctioning of a rear surface (lower surface) of the substrate W that is a non-device-forming surface. A case where the spin chuck 2 is a clamping type chuck is shown in FIG. 1 and FIG. 2.

Also, as shown in FIG. 1, the rinse liquid nozzle 4 is connected to a rinse liquid supply pipe 10 having a rinse liquid valve 9 interposed therein. When the rinse liquid valve 9 is opened, the rinse liquid is discharged toward a central portion of an upper surface of the substrate W from the rinse liquid nozzle 4. On the other hand, when the rinse liquid valve 9 is closed, the discharge of the rinse liquid from the rinse liquid nozzle 4 is stopped. As examples of the rinse liquid supplied to the rinse liquid nozzle 4, deionized water, carbonated water, electrolyzed ion water, hydrogen water, ozone water, or aqueous hydrochloric acid of dilute concentration (for example, approximately 10 to 100 ppm) can be cited.

The injection nozzle 5 is an inkjet nozzle that injects numerous droplets by an inkjet method. As shown in FIG. 1, the injection nozzle 5 is connected via a processing liquid supply pipe 11 to a processing liquid supplying mechanism 12 (processing liquid supplying unit). Further, the injection nozzle 5 is connected to a processing liquid drain pipe 14 in which a drain valve 13 is interposed. The processing liquid supplying mechanism 12 includes, for example, a pump. The processing liquid supplying mechanism 12 constantly supplies the processing liquid at a predetermined pressure (for example, of no more than 10 MPa) to the injection nozzle 5. As examples of the processing liquid supplied to the injection nozzle 5, deionized water, carbonated water, SC-1 (a mixed solution containing $NH_4OH$ and $H_2O_2$) can be cited. By controlling the processing liquid supplying mechanism 12, the controller 6 can change the pressure of the processing liquid supplied to the injection nozzle 5 to any pressure.

Also, as shown in FIG. 1, the injection nozzle 5 includes a piezo element 15 (vibration applying unit) disposed in an interior of the injection nozzle 5. The piezo element 15 is connected to a voltage applying mechanism 17 via a wiring 16. The voltage applying mechanism 17 includes, for example, an inverter. The voltage applying mechanism 17 applies an AC voltage to the piezo element 15. When the AC voltage is applied to the piezo element 15, the piezo element 15 vibrates at a frequency corresponding to a frequency of the applied AC voltage. By controlling the voltage applying mechanism 17, the controller 6 can change the frequency of the AC voltage applied to the piezo element 15 to any frequency (for example, from several hundred KHz to several MHz). The frequency of vibration of the piezo element 15 is thus controlled by the controller 6.

As shown in FIG. 1, the substrate processing apparatus 1 further includes a nozzle moving mechanism 18 (nozzle moving unit). The nozzle moving mechanism 18 includes a nozzle arm 19 holding the injection nozzle 5, a rotating mechanism 20 connected to the nozzle arm 19, and a raising and lowering mechanism 21 connected to the rotating mechanism 20. The rotating mechanism 20 is, for example, a mechanism that includes a motor. The raising and lowering mechanism 21 includes a ball screw mechanism and a motor that drives the ball screw mechanism. The rotating mechanism 20 rotates the nozzle arm 19 around a vertical axis disposed at a periphery of the spin chuck 2. The injection nozzle 5 is rotated around the vertical axis together with the nozzle arm 19. The injection nozzle 5 is thereby moved in a horizontal direction. Meanwhile, the raising and lowering mechanism 21 raises and lowers the rotating mechanism 20 in a vertical direction. The injection nozzle 5 and the nozzle arm 19 are raised and lowered in the vertical direction together with the rotating mechanism 20. The injection nozzle 5 is thereby moved in the vertical direction.

The rotating mechanism 20 moves the injection nozzle 5 horizontally within a horizontal plane that includes a region above the spin chuck 2. As shown in FIG. 2, the rotating mechanism 20 moves the injection nozzle 5 horizontally along a circularly arcuate locus X1 extending along an upper surface of the substrate W held by the spin chuck 2. The locus X1 is a curve that joins two non-overlapping positions on the substrate W when viewed from a perpendicular direction (vertical direction) perpendicular to the substrate W and passes through the center C1 of the substrate W when viewed from the vertical direction. When in a state where the injection nozzle 5 is positioned above the substrate W, the raising and lowering mechanism 21 lowers the injection nozzle 5, the injection nozzle 5 is moved close to the upper surface of the substrate W. In the state where the injection nozzle 5 is close to the upper surface of the substrate W and a plurality of droplets of the processing liquid are injected from the injection nozzle 5, the controller 6 controls the rotating mechanism 20 to move the injection nozzle 5 horizontally along the locus X1. The injection nozzle 5 thereby moves along the upper surface of the substrate W.

Figure 5:
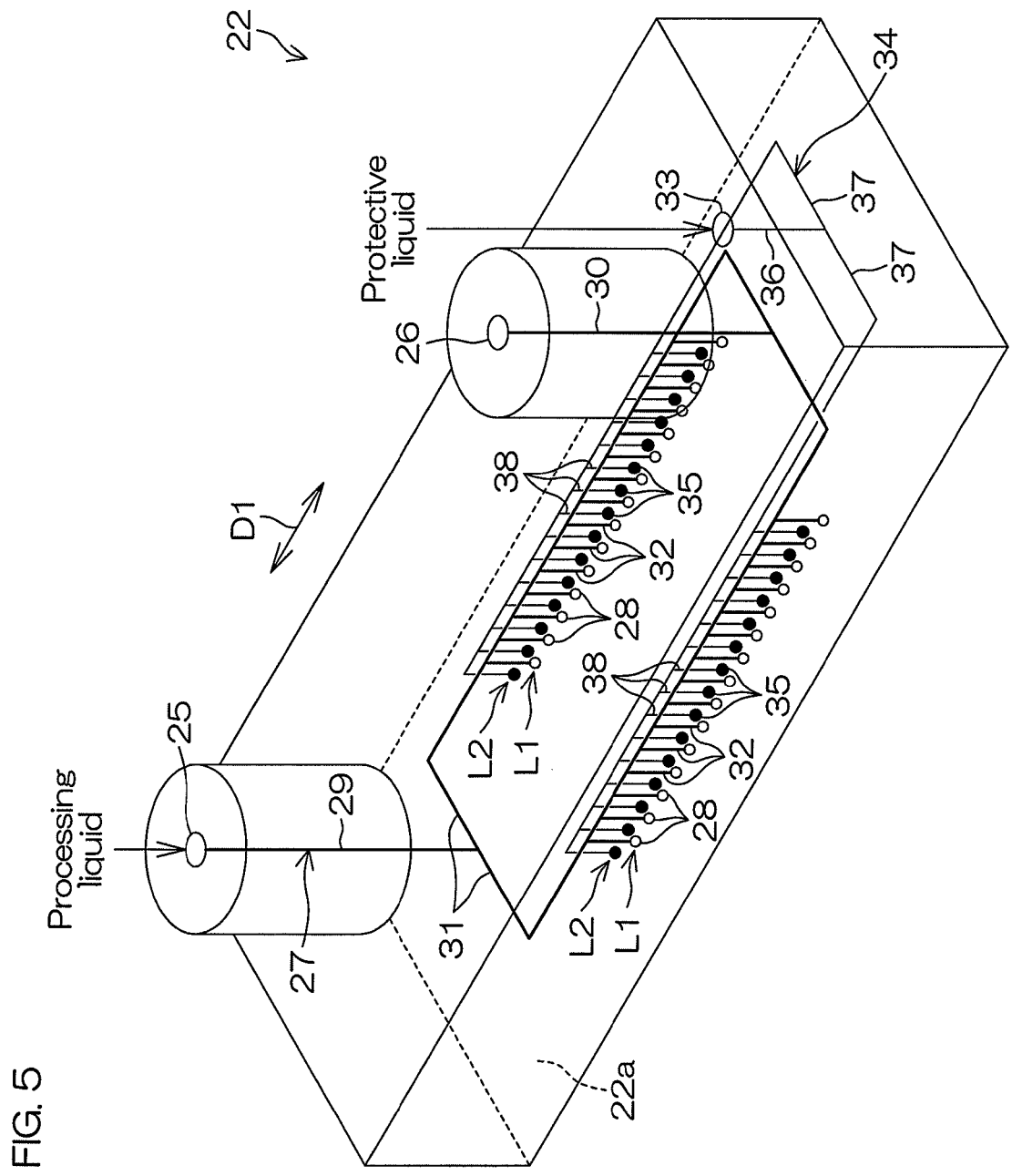
FIG. 5 is a schematic view for describing a flow passage of the nozzle according to the first preferred embodiment of the present invention.

FIG. 3 is a schematic side view of the injection nozzle 5. FIG. 4 is a schematic plan view of the injection nozzle 5. FIG. 5 is a schematic view for describing a flow passage of the injection nozzle 5. In FIG. 4, only a lower surface of the injection nozzle 5 (a lower surface 22a of a main body 22) is shown.

As shown in FIG. 3, the injection nozzle 5 includes the main body 22 that injects the droplets of the processing liquid, a cover 23 covering the main body 22, a plurality of the piezo elements 15 covered by the cover 23, and a seal 24 interposed between the main body 22 and the cover 23. The main body 22 and the cover 23 are both formed of materials with chemical resistance. The main body 22 is formed, for example, of quartz. The cover 23 is formed, for example, of a fluorine-based resin. The seal 24 is formed, for example, of an elastic material. The main body 22 has a strength capable of withstanding a high pressure. The piezo elements 15 and a portion of the main body 22 are housed in an interior of the cover 23. An end portion of the wiring 16 is connected, for example, by solder, to the piezo elements 15 in the interior of the cover 23. The interior of the cover 23 is sealed by the seal 24. The main body 22 has the horizontal lower surface 22a facing the upper surface of the substrate W. The droplets of the processing liquid are injected from the lower surface 22a of the main body 22.

Specifically, as shown in FIG. 5, the main body 22 includes a processing liquid supply port 25 supplied with the processing liquid, a processing liquid drain port 26 from which the processing liquid supplied to the processing liquid supply port 25 is drained, a processing liquid flow passageway 27 connecting the processing liquid supply port 25 and the processing liquid drain port 26, and a plurality of injection ports 28 connected to the processing liquid flow passageway 27. The processing liquid flow passageway 27 includes a processing liquid upstream passage 29 connected to the processing liquid supply port 25, a processing liquid downstream passage 30 connected to the processing liquid drain port 26, a plurality of processing liquid branch passages 31 respectively connecting the processing liquid upstream passage 29 and the processing liquid downstream passage 30, and a plurality of processing liquid connection passages 32 connected to the plurality of processing liquid branch passages 31.

As shown in FIG. 5, the processing liquid upstream passage 29 and the processing liquid down stream passage 30 extend in a vertical direction. The processing liquid branch passages 31 extend horizontally from a lower end of the processing liquid upstream passage 29 to a lower end of the processing liquid downstream passage 30. The processing liquid connection passages 32 extend vertically downward from the processing liquid branch passages 31. The plurality of injection ports 28 are connected respectively to the plurality of processing liquid connection passages 32. The injection ports 28 are thus connected to the processing liquid branch passages 31 via the processing liquid connection passages 32. The injection ports 28 are microscopic pores with a diameter, for example, of several μm to several dozen μm. The plurality of injection ports 28 open at the lower surface 22a of the main body 22.

As shown in FIG. 5, the main body 22 further includes a protective liquid supply port 33 supplied with a protective liquid that protects the substrate W, a protective liquid flow passageway 34 connected to the protective liquid supply port 33, and a plurality of discharge ports 35 connected to the protective liquid flow passageway 34. The protective liquid flow passageway 34 includes a protective liquid upstream passage 36 connected to the protective liquid supply port 33, a plurality of protective liquid branch passages 37 connected to the protective liquid upstream passage 36, and a plurality of protective liquid connection passages 38 connected to the plurality of protective liquid branch passages 37.

As shown in FIG. 5, the protective liquid upstream passage 36 extends in the vertical direction. The protective liquid branch passages 37 extend horizontally from a lower end of the protective liquid upstream passage 36. The protective liquid connection passages 38 extend vertically downward from the protective liquid branch passages 37. The plurality of discharge ports 35 are connected respectively to the plurality of protective liquid connection passages 38. The discharge ports 35 are thus connected to the protective liquid branch passages 37 via the protective liquid connection passages 38. The discharge ports 35 are openings of greater area than the injection ports 28. The plurality of discharge ports 35 open at the lower surface 22a of the main body 22. The injection ports 28 and the discharge ports 35 thus open at the same plane.

As shown in FIG. 4, the plurality of injection ports 28 form a plurality of (for example, two) columns L1. Each column L1 is made up of numerous (for example, no less than 10) injection ports 28. The plurality of injection ports 28 that make up a column L1 in common are, for example, aligned at equal intervals. Each column L1 extends rectilinearly along a horizontal longitudinal direction D1. The two columns L1 are disposed in parallel across an interval in a horizontal direction orthogonal to the longitudinal direction D1. Each column L1 is not restricted to being rectilinear and may be curved. The plurality of piezo elements 15 are disposed respectively along the plurality of columns L1. The piezo elements 15 are mounted to the main body 22 at positions at which the vibrations of the piezo elements 15 are transmitted to the processing liquid flowing through the processing liquid branch passages 31. The piezo elements 15 may be disposed above the main body 22 or may be disposed at sides of the main body 22.

As shown in FIG. 4, a discharge port 35 is provided for each injection port 28. That is, the same number of discharge ports 35 as the injection ports 28 are provided in the main body 22. The plurality of discharge ports 35 correspond respectively to the plurality of injection ports 28. A positional relationship of a pair of an injection port 28 and a discharge port 35 is the same for all pairs. The plurality of discharge ports 35 thus form a plurality of (for example, two) columns L2 in the same manner as the plurality of injection ports 28. The two columns L2 extend in the longitudinal direction D1 along the two columns L1. One column L2 (the column L2 at a lower side in FIG. 4) is disposed at an inner side of (in between) the two columns L1 and the other column L2 (the column L2 at the upper side in FIG. 4) is disposed at an outer side of the two columns L1.

As shown in FIG. 3, the processing liquid supply pipe 11 and the processing liquid drain pipe 14 are connected respectively to the processing liquid supply port 25 and the processing liquid drain port 26. The processing liquid supplying mechanism 12 (see FIG. 1) is thus connected to the processing liquid supply port 25 via the processing liquid supply pipe 11. The processing liquid supplying mechanism 12 constantly supplies the processing liquid at a high pressure to the processing liquid supply port 25. In a state where the drain valve 13 is closed, a liquid pressure in the processing liquid flow passageway 27 is maintained at a high pressure. Thus, in this state, the processing liquid is injected from each injection port 28 as a continuous flow due to the liquid pressure. Further, when the AC voltage is applied to the piezo elements 15 in this state, the vibration of the piezo elements 15 is applied to the processing liquid flowing through the processing liquid flow passageway 27 and the processing liquid injected from the respective injection ports 28 is severed by the vibration. Droplets of the processing liquid are thereby injected from the respective injection ports 28. Numerous droplets of the processing liquid of uniform particle diameter are thereby injected simultaneously at uniform speed.

On the other hand, when the drain valve 13 is open, the processing liquid flowing through the processing liquid flow passageway 27 is drained from the processing liquid drain port 26 to the processing liquid drainpipe 14. Thus, in this state, the liquid pressure in the processing liquid flow passageway 27 does not rise adequately. The injection ports 28 are microscopic pores and thus to make the processing liquid be injected from the injection ports 28, the liquid pressure in the processing liquid flow passageway 27 is required to be raised to no less than a predetermined value. However, in the present state, the liquid pressure in the processing liquid flow passageway 27 is a low pressure and thus the processing liquid in the processing liquid flow passageway 27 is drained to the processing liquid drain pipe 14 from the processing liquid drain port 26 without being injected from the injection ports 28. The injecting of the processing liquid from the injection ports 28 is thus controlled by the opening and closing of the drain valve 13. The controller 6 opens the drain valve 13 while the injection nozzle 5 is not used for processing the substrate W (during standby of the injection nozzle 5). A state where the processing liquid flows through the interior of the injection nozzle 5 is thus maintained even during standby of the injection nozzle 5.

Also, as shown in FIG. 3, a protective liquid supply pipe 41, having a protective liquid valve 39 and a flow regulating valve 40 interposed therein, is connected to the protective liquid supply port 33. When the protective liquid valve 39 is opened, the protective liquid is supplied to the protective liquid supply port 33 at a flow rate corresponding to an opening degree of the flow regulating valve 40. The protective liquid is thereby discharged from the respective discharge ports 35. A rinse liquid or a chemical solution (for example, SC-1) can be cited as an example of the protective liquid supplied to the discharge ports 35. The controller 6 (see FIG. 1) makes the protective liquid be discharged from the respective discharge ports 35 in a state where the lower surface (lower surface 22a of the main body 22) of the injection nozzle 5 faces the upper surface of the substrate W. The protective liquid is thereby supplied to the upper surface of the substrate W and a plurality of liquid films of the protective liquid that respectively cover a plurality of regions within the upper surface of the substrate W are formed. As shall be described below, the droplets of the processing liquid are injected toward the upper surface of the substrate W that is covered by the liquid films of the protective liquid.

Figure 6:
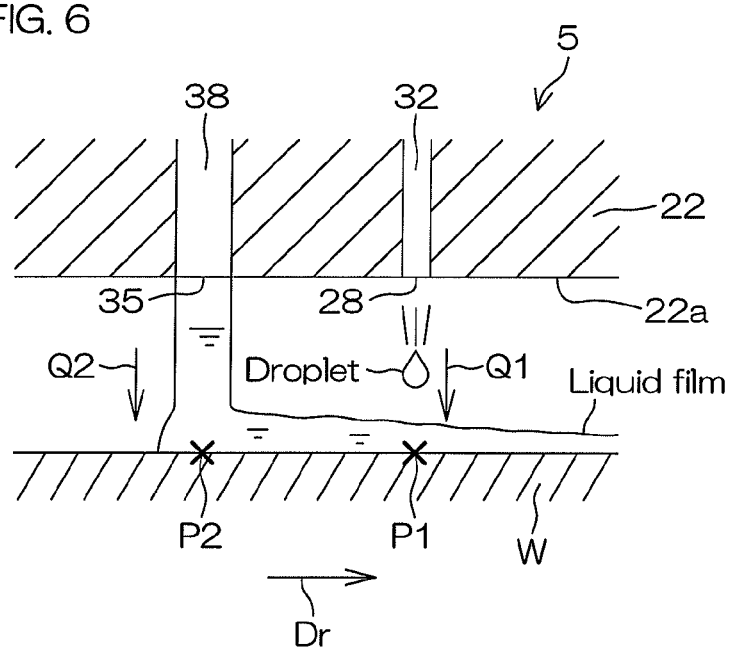
FIG. 6 is a schematic sectional view of the nozzle taken along line VI-VI in FIG. 4.
Figure 7:
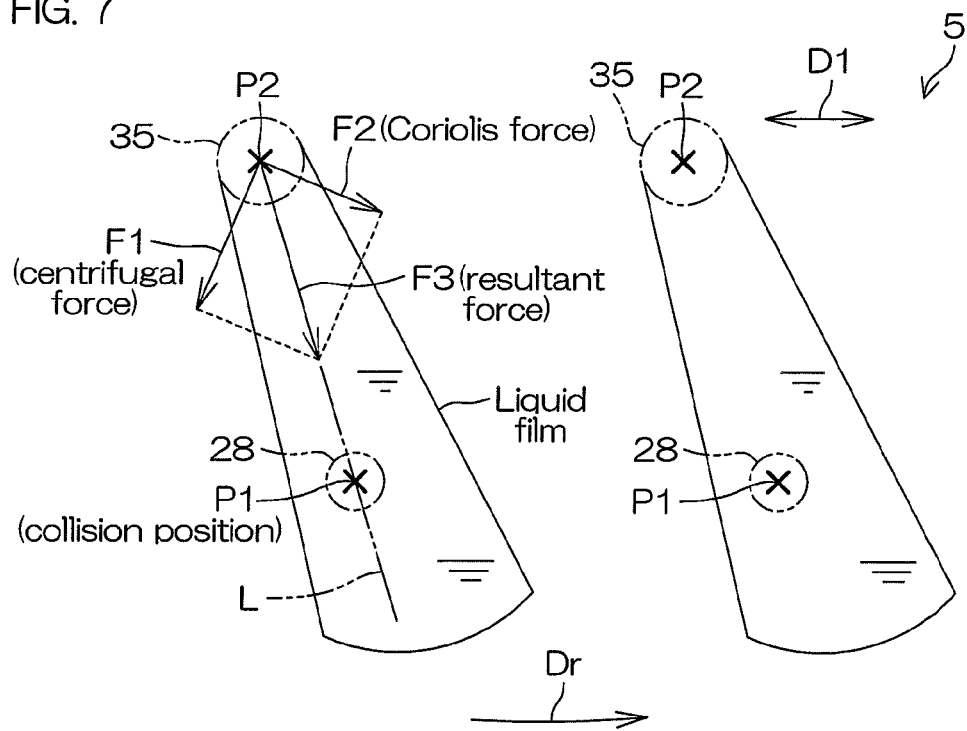
FIG. 7 is a plan view for describing a positional relationship between injection ports and discharge ports according to the first preferred embodiment of the present invention.

FIG. 6 is a schematic sectional view of the injection nozzle 5 taken along line VI-VI in FIG. 4. FIG. 7 is a plan view for describing a positional relationship between the injection ports 28 and the discharge ports 35.

As shown in FIG. 6, an injection port 28 injects a droplet in an injection direction Q1 towards a collision position P1 within the upper surface of the substrate W. The injection direction Q1 is directed from the injection port 28 to the collision position P1. The injection direction Q1 is set by a direction of the processing liquid connection passage 32. In the first preferred embodiment, the processing liquid connection passage 32 extends in the vertical direction and thus the injection direction Q1 is the vertical direction. The injection port 28 thus injects the droplet vertically downward toward the collision position P1.

Likewise, as shown in FIG. 6, the discharge port 35 discharges the protective liquid in a discharge direction Q2 toward a liquid contact position P2 within the upper surface of the substrate W. The discharge direction Q2 is directed from the discharge port 35 to the liquid contact position P2. The discharge direction Q2 is set by a direction of the protective liquid connection passage 38. In the first preferred embodiment, the protective liquid connection passage 38 extends in the vertical direction and thus the discharge direction Q2 is the vertical direction. The discharge port 35 thus discharges the protective liquid vertically downward toward the liquid contact position P2.

The processing liquid and the protective liquid are thus discharged in the vertical direction from the injection port 28 and the discharge port 35 and thus the positional relationship of the collision position P1 and the liquid contact position P2 is the same as the positional relationship of the injection port 28 and the discharge port 35. An angle (central angle) formed by a line segment joining the center C1 of the substrate W and the collision position P1 and a line segment joining the center C1 of the substrate W and the liquid contact position P2 is, for example, no more than 90 degrees, and the liquid contact position P2 is set further toward the rotation axis A1 than the corresponding collision position P1 and is set further upstream than the corresponding collision position P1 with respect to the substrate rotation direction Dr.

As shown in FIG. 6, the controller 6 makes the protective liquid be discharged from the plurality of discharge ports 35 in a state where the lower surface (lower surface 22a of the main body 22) of the injection nozzle 5 faces the upper surface of the substrate W and the substrate W is rotating in the substrate rotation direction Dr. The protective liquid discharged from the plurality of discharge ports 35 contacts the plurality of liquid contact positions P2 respectively. The plurality of liquid films of the protective liquid respectively covering the plurality of regions within the upper surface of the substrate W as shown in FIG. 7 are thereby formed. The plurality of liquid films are respectively formed by the protective liquid discharged from the plurality of discharge ports 35.

The protective liquid is supplied to the substrate W in the rotating state and thus the protective liquid on the substrate W moves outward in a rotation radius direction (direction away from the rotation axis A1) due to a centrifugal force. The outwardly directed centrifugal force F1 and a Coriolis force F2 in a direction orthogonal to the direction of movement of the protective liquid are thus applied to the protective liquid on the substrate W as shown in FIG. 7. The protective liquid on the liquid contact position P2 spreads outward along the upper surface of the substrate W while mainly moving in a direction of a resultant force F3 of the two forces (centrifugal force F1 and Coriolis force F2). A fan-shaped liquid film centered at the liquid contact position P2 is thereby formed by the protective liquid. Further, the protective liquid supplied to the upper surface of the substrate W flows to a downstream side of the substrate rotation direction Dr and thus a fan-shaped liquid film that is wider at the downstream side than at the upstream side with respect to the direction of the resultant force F3 is formed by the protective liquid.

A rotation speed of the substrate W, the positional relationship of the injection ports 28 and the discharge ports 35, and a discharge flow rate of the protective liquid from the discharge ports 35 are set so that the plurality of the collision positions P1 are covered respectively by the plurality of liquid films. The rotation speed of the substrate W, etc., may be set so that the plurality of liquid films overlap partially on the substrate W or may be set so that the liquid films do not overlap on the substrate W. As shown in FIG. 7, the positional relationship of the injection ports 28 and the discharge ports 35 are set so that the collision position P1 is positioned on the extension line L extending in the direction of the resultant force F3. The protective liquid contacting the liquid contact position P2 mainly moves in the direction of the resultant force F3 and thus if the distance from the liquid contact position P2 is fixed, a flow rate of the protective liquid is greatest on the extension line L. Thus, by positioning the collision position P1 on the extension line L, a liquid film of predetermined thickness can be formed at the collision position P1 while reducing the discharge flow rate of the protective liquid.

FIG. 8A to FIG. 8D are diagrams for describing an example of processing of a substrate W performed by the substrate processing apparatus 1 according to the first preferred embodiment of the present invention. FIG. 1 and FIG. 8A to FIG. 8D shall be referenced in the following description.

An unprocessed substrate W is conveyed by a conveying robot (not shown in Figures) and placed on the spin chuck 2 with, for example, a top surface, which is a device-forming surface, faced upward. The controller 6 then makes spin chuck 2 hold the substrate W. Thereafter, the controller 6 controls the spin motor 8 to rotate the substrate W held by the spin chuck 2.

Thereafter, a first covering process of supplying deionized water, which is an example of a rinse liquid, from the rinse liquid nozzle 4 to the substrate W and covering the upper surface of the substrate W with deionized water is performed. Specifically, while making the spin chuck 2 rotate the substrate W, the controller 6 opens the rinse liquid valve 9 to make deionized water be discharged from the rinse liquid nozzle 4 onto an upper surface central portion of the substrate W held by the spin chuck 2 as shown in FIG. 8A. The deionized water discharged from the rinse liquid nozzle 4 is supplied to the upper surface central portion of the substrate W and spreads outward along the upper surface of the substrate W upon receiving the centrifugal force due to the rotation of the substrate W. The deionized water is thereby supplied to the entire upper surface of the substrate W and a liquid film of deionized water that covers the entire upper surface of the substrate W is formed. Then, after elapse of a predetermined time from the opening of the rinse liquid valve 9, the controller 6 closes the rinse liquid valve 9 and stops the discharging of deionized water from the rinse liquid nozzle 4.

Thereafter, a cleaning process of cleaning the substrate W by supplying droplets of carbonated water, which is an example of the processing liquid, from the injection ports 28 of the injection nozzle 5 to the substrate W and a second covering process of covering the upper surface of the substrate W with SC-1, which is an example of the protective liquid, by supplying SC-1 from the discharge ports 35 of the injection nozzle 5 to the substrate W are performed in parallel. Specifically, the controller 6 controls the nozzle moving mechanism 18 to move the injection nozzle 5 to above the spin chuck 2 and bring the lower surface 22a of the injection nozzle 5 close to the upper surface of the substrate W. Thereafter, while making the spin chuck 2 rotate the substrate W, the controller 6 opens the protective liquid valve 39 to make SC-1 be discharged from the discharge ports 35 of the injection nozzle 5 as shown in FIG. 8B. The plurality of liquid films respectively covering the plurality of collision positions P1 are thereby formed by the SC-1.

Meanwhile, in parallel to the discharging of SC-1 from the discharge ports 35 of the injection nozzle 5, the controller 6 makes droplets of carbonated water be injected from the injection ports 28 of the injection nozzle 5. Specifically, in the state where the lower surface 22a of the injection nozzle 5 is close to the upper surface of the substrate W and SC-1 is being discharged from the discharge ports 35 of the injection nozzle 5, the controller 6 closes the drain valve 13 and makes the voltage applying mechanism 17 apply the AC voltage of the predetermined frequency to the piezo elements 15. Further, while making the substrate W rotate and making SC-1 be discharged from the discharge ports 35 of the injection nozzle 5, the controller 6 makes the nozzle moving mechanism 18 move the injection nozzle 5 reciprocatingly between a central position Pc and a peripheral edge position Pe a plurality of times (half scan) as shown in FIG. 8B. As indicated by solid lines in FIG. 2, the central position Pc is a position at which the injection nozzle 5 overlaps with a central portion of the substrate W in a plan view, and as indicated by an alternate long and two short dashed lines in FIG. 2, the peripheral edge position Pe is a position at which the injection nozzle 5 and a peripheral edge portion of the substrate W overlap in a plan view.

By numerous droplets of carbonated water being injected downward from the injection ports 28 of the injection nozzle 5, the numerous droplets of carbonated water are injected onto the collision positions P1 covered by the liquid films of SC-1. Also, the controller 6 moves the injection nozzle 5 between the central position Pc and the peripheral edge position Pe while rotating the substrate W and thus the upper surface of the substrate W is scanned by the collision positions P1 so that the collision positions P1 pass across the entire upper surface of the substrate W. The droplets of carbonated water are thus injected across the entire upper surface of the substrate W. Particles and other foreign matter attached to the upper surface of the substrate W are physically removed by collision of the droplets with the substrate W. Also, a binding force between a foreign matter and the substrate W is weakened by dissolution of the substrate W by SC-1. The foreign matter is thus removed more reliably. Also, reattachment of foreign matter to the substrate W is suppressed or prevented because the droplets of carbonated water are injected onto the collision positions P1 in the state where the entire upper surface of the substrate W is covered by the liquid films. The cleaning process is thus performed in parallel to the second covering process. When the cleaning process and the second covering process have been performed for a predetermined time, the controller 6 opens the drain valve 13 to stop the injecting of droplets from the injection nozzle 5. Further, the controller 6 closes the protective liquid valve 39 to stop the discharge of SC-1 from the injection nozzle 5.

Thereafter, a rinsing process of supplying deionized water, which is an example of the rinse liquid, from the rinse liquid nozzle 4 to the substrate W is performed to rinse off liquid and foreign matter attached to the substrate W. Specifically, while making the spin chuck 2 rotate the substrate W, the controller 6 opens the rinse liquid valve 9 to make deionized water be discharged from the rinse liquid nozzle 4 onto the upper surface central portion of the substrate W held by the spin chuck 2 as shown in FIG. 8C. The deionized water discharged from the rinse liquid nozzle 4 is supplied to the upper surface central portion of the substrate W and spreads outward along the upper surface of the substrate W upon receiving the centrifugal force due to the rotation of the substrate W. Deionized water is thereby supplied to the entire upper surface of the substrate W and the liquid and foreign matter attached to the substrate W are thereby rinsed off. After elapse of a predetermined time from the opening of the rinse liquid valve 9, the controller 6 closes the rinse liquid valve 9 and stops the discharging of deionized water from the rinse liquid nozzle 4.

Thereafter, a drying process (spin drying) of drying the substrate W is performed. Specifically, the controller 6 controls the spin motor 8 to rotate the substrate W at a high rotation speed (for example, several thousand rpm). A large centrifugal force is thereby made to act on the deionized water attached to the substrate W and the deionized water attached to the substrate W is spun off to a periphery of the substrate W as shown in FIG. 8D. The deionized water is thereby removed from the substrate W and the substrate W dries. After the drying process has been performed for a predetermined time, the controller 6 controls the spin motor 8 to stop the rotation of the substrate W by the spin chuck 2. Thereafter, the processed substrate W is conveyed out from the spin chuck 2 by the conveying robot.

As described above, with the first preferred embodiment, the protective liquid is discharged from the plurality of discharge ports 35 in parallel to the injecting of the droplets of the processing liquid from the plurality of injection ports 28. The droplets of the processing liquid are thus injected toward the upper surface of the substrate W that is protected by the protective liquid. The plurality of liquid films of the protective liquid that respectively cover the plurality of regions within the upper surface of the substrate W are formed because the protective liquid is discharged from the plurality of discharge ports 35 respectively to the plurality of liquid contact positions P2. The plurality of collision positions P1 are covered respectively by the plurality of liquid films. States of supplying of the processing liquid at the respective collision positions P1 can thus be made more uniform than in a case where a single liquid film covers all of the collision positions P1. Variation of the liquid film thickness among the respective collision positions P1 can thus be reduced. The thickness of the liquid film at each collision position P1 can thus be made to approach an optimal value and a processing quality of the substrate W can be improved.

With the first preferred embodiment, a case where the discharge ports 35 that discharge the protective liquid are provided in the injection nozzle 5 was described. However, the discharge ports 35 may be provided in a member different from the injection nozzle 5. For example, a protective liquid nozzle (liquid film forming unit) in which the discharge ports 35 are formed may be provided, and the protective liquid supply pipe 41 (see FIG. 1) may be connected to the protective liquid nozzle. In this case, a plurality of protective liquid nozzles may be provided or a plurality of discharge ports 35 may be formed in a single protective liquid nozzle.

Also, with the first preferred embodiment, a case where the positional relationship between a pair of the injection port 28 and the discharge port 35 is equivalent for all pairs was described. However, pairs of the injection port 28 and the discharge port 35 that differ in positional relationship from other pairs of the injection port 28 and the discharge port 35 may be provided in the injection nozzle 5. A direction of flow of the protective liquid on the substrate W (direction directed from the liquid contact position P2 to the collision position P1) thus does not have to be fixed.

Also, with the first preferred embodiment, a case where the droplet injection direction Q1 and the protective liquid discharge direction Q2 are parallel directions and the positional relationship of the injection ports 28 and the discharge ports 35 is the same as the positional relationship of the collision positions P1 and the liquid contact positions P2 was described. However, the injection direction Q1 and the discharge direction Q2 do not have to be parallel and the positional relationship of the injection ports 28 and the discharge ports 35 may differ from the positional relationship of the collision positions P1 and the liquid contact positions P2. For example, the injection direction Q1 may be the vertical direction while the discharge direction Q2 is a direction that is inclined with respect to the vertical direction. In this case, a manner in which the protective liquid spreads on the substrate W can be changed by changing an inclination angle of the discharge direction Q2 with respect to the vertical direction.

Also, with the first preferred embodiment, a case where the protective liquid supplied to the substrate W spreads on the substrate W by receiving the forces (centrifugal force and Coriolis force) generated in accordance with the rotation of the substrate W was described. However, if the protective liquid discharge direction Q2 is inclined with respect to the vertical direction, the protective liquid supplied to the substrate W spreads in a generally fixed direction on the substrate W even if the substrate W is not rotating. Thus, if the discharge direction Q2 is inclined with respect to the vertical direction, the protective liquid may be supplied to the substrate W in a non-rotating state.

Also, with the first preferred embodiment, a case where the plurality of injection ports 28 form a plurality of columns L1 and the plurality of columns L1 are disposed in parallel was described. However, the plurality of columns L1 do not have to be disposed in parallel. Further, the plurality of injection ports 28 do not have to form a plurality of columns L1.

Also, with the first preferred embodiment, a case where, in the state where the injection nozzle 5 is injecting the droplets of the processing liquid, the controller 6 makes the injection nozzle 5 move along the locus X1 between the central position Pc and the peripheral edge position Pe by the nozzle moving mechanism 18 was described. That is, a case where a half scan is performed was described. However, a full scan may be performed instead. Specifically, the controller 6 may make the injection nozzle 5 move along the locus X1 between two positions above a peripheral edge portion of the substrate W by the nozzle moving mechanism 18 in the state where the injection nozzle 5 is injecting the droplets of the processing liquid.

Also, with the first preferred embodiment, a case where the substrate processing apparatus 1 is an apparatus that processes the circular substrate W was described. However, the substrate processing apparatus 1 may be an apparatus that processes a polygonal substrate, such as a substrate for liquid crystal display.

Second Preferred Embodiment

Figure 9:
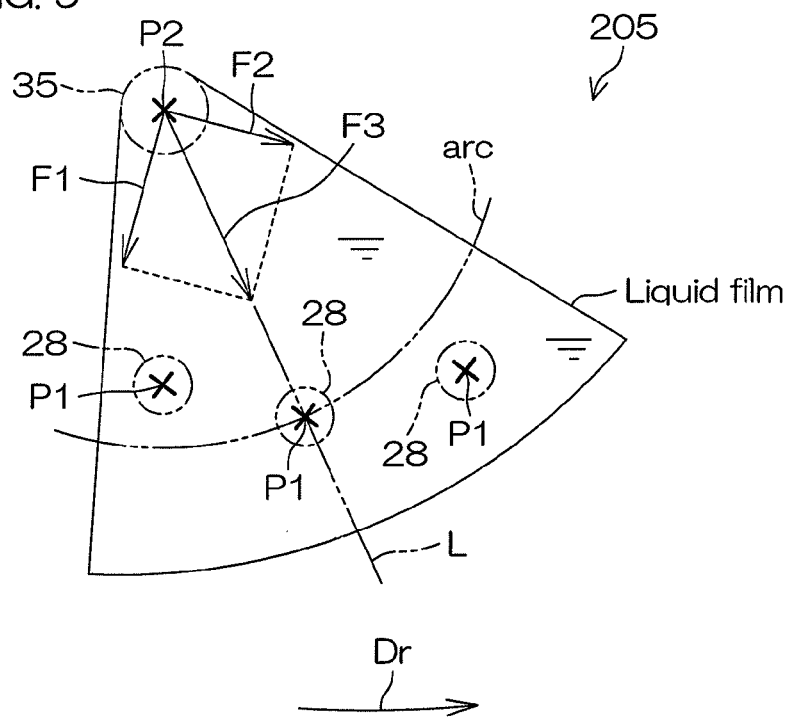
FIG. 9 is a plan view for describing a positional relationship between injection ports and a discharge port according to a second preferred embodiment of the present invention.

FIG. 9 is a plan view for describing a positional relationship between injection ports 28 and a discharge port 35 according to a second preferred embodiment of the present invention. In FIG. 9, component portions corresponding to respective portions indicated in FIG. 1 to FIG. 7 and FIG. 8A to FIG. 8D described above are provided with the same reference symbols as in FIG. 1, etc., and description thereof shall be omitted.

A principal point of difference of the second preferred embodiment with respect to the first preferred embodiment is that a single discharge port 35 corresponds to the plurality of injection ports 28.

Specifically, an injection nozzle 505 (injection unit, liquid film forming unit) includes a plurality of the injection ports 28 and a plurality of the discharge ports 35. As in the first preferred embodiment, the injection direction Q1 (see FIG. 6) and the discharge direction Q2 (see FIG. 6) are parallel directions and the positional relationship of the injection ports 28 and the discharge ports 35 is the same as the positional relationship of the collision positions P1 and the liquid contact positions P2. A plurality of collision positions P1 are set so as to be disposed along a circular arc "arc" centered at a liquid contact position P2. An injection port 28 that is intermediate with respect to the substrate rotation direction Dr is disposed on the circular arc "arc." A collision position P1 further upstream the intermediate injection port 28 is disposed at an inner side of the circular arc "arc," and the injection port 28 further downstream the intermediate injection port 28 is disposed at an outer side of the circular arc "arc." The liquid contact position P2 is set further to the rotation axis A1 (see FIG. 1) side than the plurality of collision positions P1 and further upstream than the plurality of collision positions P1 with respect to the substrate rotation direction Dr.

The controller 6 (see FIG. 1) discharges the protective liquid from the respective discharge ports 35 to supply the protective liquid to the upper surface of the substrate W in the rotating state. A plurality of liquid films of the protective liquid respectively covering a plurality of regions within the upper surface of the substrate W are thereby formed. The rotation speed of the substrate W, the positional relationship of the injection ports 28 and the discharge ports 35, and the discharge flow rate of the protective liquid from the discharge ports 35 are set so that a plurality of collision positions P1 are covered by the protective liquid discharged from a single discharge port 35. The controller 6 makes the droplets of the processing liquid be injected from the injection ports 28 toward the collision positions P1 covered by the liquid film of the protective liquid. Particles are thereby removed while suppressing or preventing occurrence of damage.

As described above, with the second preferred embodiment, a single liquid contact position P2 corresponds to a plurality of collision positions P1 and the plurality of collision positions P1 are covered by the protective liquid supplied to the liquid contact position P2 in common. The thickness of a liquid film of the protective liquid decreases with an increase in distance of separation from the liquid contact position P2. Put in another way, if the distance from the liquid contact position P2 is fixed, the liquid film thickness at the corresponding position is substantially fixed. The plurality of collision positions P1 corresponding to the liquid contact position P2 in common are set along the circular arc "arc" centered at the liquid contact position P2 in common. Variation of the liquid film thickness among these collision positions P1 can thus be reduced further. The processing quality of the substrate W can thereby be improved further.

Third Preferred Embodiment

Figure 10:
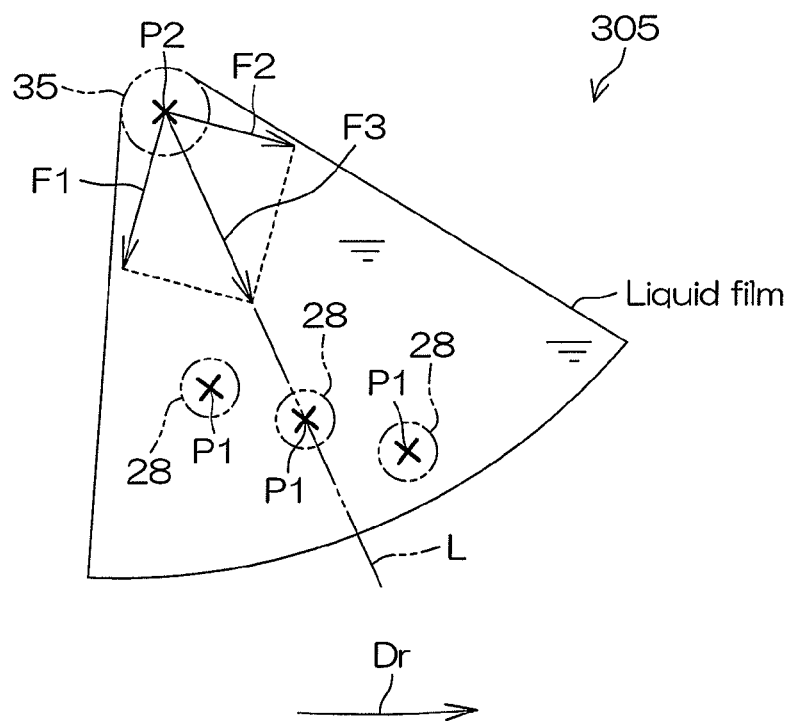
FIG. 10 is a plan view for describing a positional relationship between injection ports and a discharge port according to a third preferred embodiment of the present invention.

FIG. 10 is a plan view for describing a positional relationship between injection ports 28 and a discharge port 35 according to a third preferred embodiment of the present invention. In FIG. 10, component portions corresponding to respective portions indicated in FIG. 1 to FIG. 9 described above are provided with the same reference symbols as in FIG. 1, etc., and description thereof shall be omitted.

A principal point of difference of the third preferred embodiment with respect to the second preferred embodiment is that the positional relationship of the injection ports 28 and the discharge port 35 is different.

Specifically, an injection nozzle 605 (injection unit, liquid film forming unit) includes a plurality of the injection ports 28 and a plurality of the discharge ports 35. As in the second preferred embodiment, in the third preferred embodiment, a single discharge port 35 corresponds to a plurality of injection ports 28. As in the first preferred embodiment, the injection direction Q1 (see FIG. 6) and the discharge direction Q2 (see FIG. 6) are parallel directions and the positional relationship of the injection ports 28 and the discharge ports 35 is the same as the positional relationship of the collision positions P1 and the liquid contact positions P2. A plurality of collision positions P1 are set so as to be disposed along the extension line L extending in the direction of the resultant force F3. The collision position P1 at the innermost side (nearest to the contact position P2) is disposed further upstream than the extension line L with respect to the substrate rotation direction Dr, and the outermost collision position P1 is disposed further downstream than the extension line L with respect to the substrate rotation direction Dr. An intermediate collision position P1 is disposed on the extension line L. The plurality of collision positions P1 are set so as not to overlap when viewed from the direction of the resultant force F3. Further, the liquid contact position P2 is set further to the rotation axis A1 (see FIG. 1) side than the plurality of collision positions P1 and further upstream than the plurality of collision positions P1 with respect to the substrate rotation direction Dr.

The controller 6 (see FIG. 1) discharges the protective liquid from the respective discharge ports 35 to supply the protective liquid to the upper surface of the substrate W in the rotating state. A plurality of liquid films of the protective liquid respectively covering a plurality of regions within the upper surface of the substrate W are thereby formed. The rotation speed of the substrate W, the positional relationship of the injection ports 28 and the discharge ports 35, and the discharge flow rate of the protective liquid from the discharge ports 35 are set so that a plurality of collision positions P1 are covered by the protective liquid discharged from a single discharge port 35. The controller 6 makes the droplets of the processing liquid be injected from the injection ports 28 toward the collision positions P1 covered by the liquid film of the protective liquid. Particles are thereby removed while suppressing or preventing occurrence of damage.

As described above, with the third preferred embodiment, a single liquid contact position P2 corresponds to a plurality of collision positions P1 and the plurality of collision positions P1 are covered by the protective liquid supplied to the liquid contact position P2 in common. The plurality of collision positions P1 corresponding to the liquid contact position P2 in common are set along the extension line L of the resultant force F3 (resultant force of the centrifugal force F1 and the Coriolis force F2) acting on the protective liquid on the contact position P2 in accordance with the rotation of the substrate W. The protective liquid is thus supplied efficiently to the plurality of collision positions P1 corresponding to the liquid contact position P2 in common. Further, the plurality of collision positions P1 corresponding to the liquid contact position P2 in common are set so as not to overlap when viewed from the direction of the resultant force F3. Blocking of the protective liquid, to be supplied to a collision position P1 at a downstream side with respect to the direction of the resultant force F3, by the droplets of the processing liquid injected toward a collision position P1 at an upstream side can thus be suppressed or prevented. The protective liquid can thereby be supplied reliably to the respective collision positions P1.

Fourth Preferred Embodiment

In accordance with another aspect of the present invention, a nozzle for making droplets collide with a substrate covered by a liquid film may have an arrangement exemplified by a fourth preferred embodiment described below.

Figure 11:
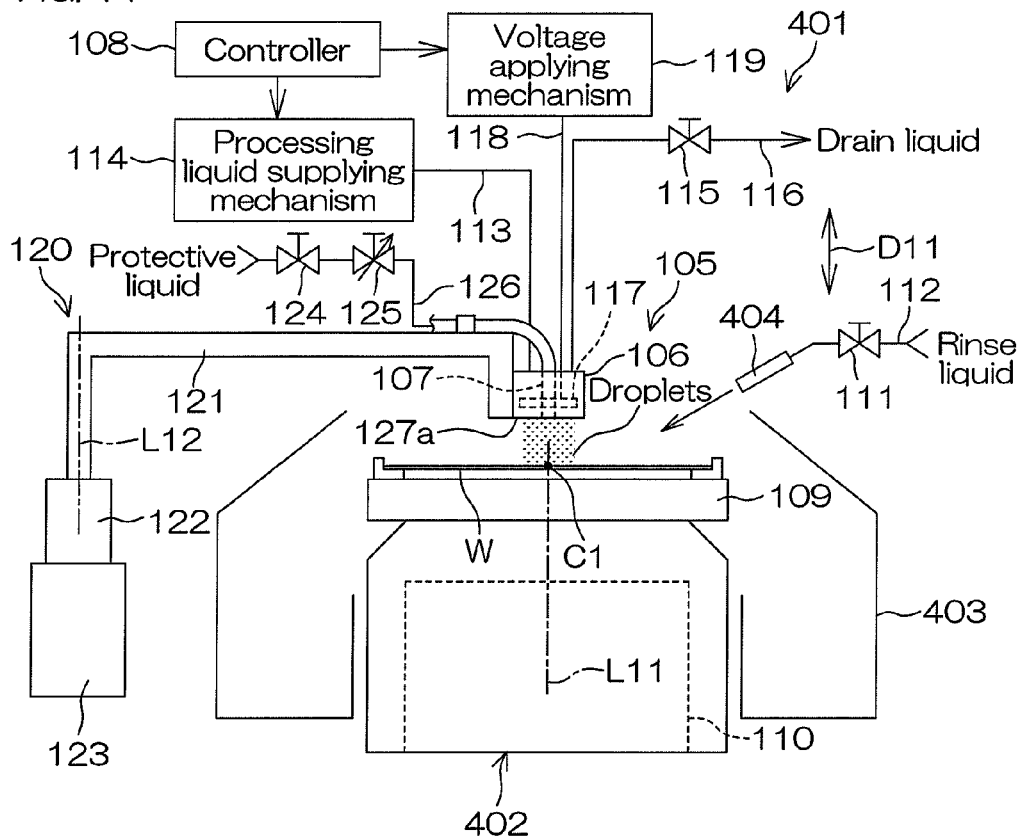
FIG. 11 is a schematic view of a general arrangement of a substrate processing apparatus according to a fourth preferred embodiment of the present invention.
Figure 12:
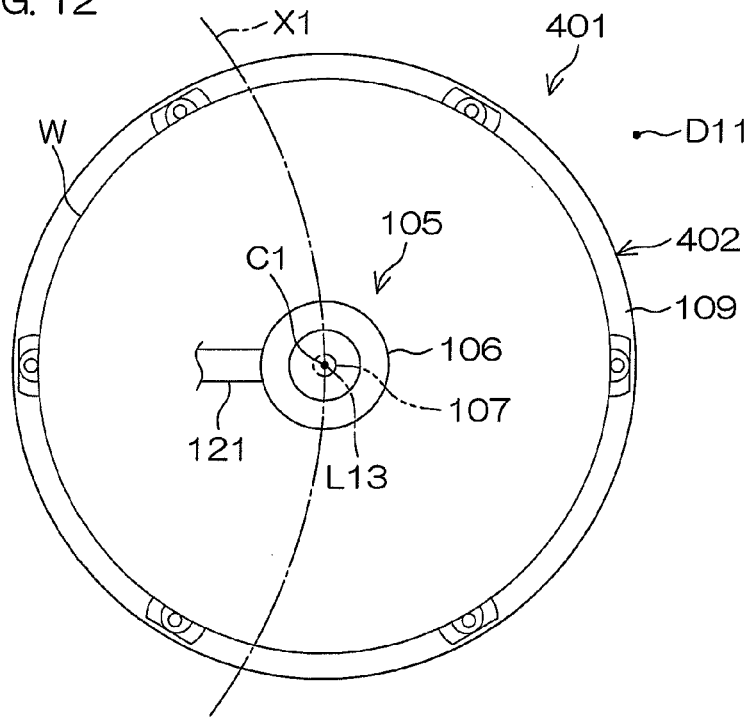
FIG. 12 is a plan view of a cleaning nozzle and an arrangement related thereto according to the fourth preferred embodiment of the present invention.

FIG. 11 is a schematic view of a general arrangement of a substrate processing apparatus 401 according to the fourth preferred embodiment of the present invention. FIG. 12 is a plan view of a cleaning nozzle 105 and an arrangement related thereto according to the fourth preferred embodiment of the present invention.

The substrate processing apparatus 401 is a one-by-one type substrate processing apparatus that processes a semiconductor wafer or other circular substrate W one at a time. As shown in FIG. 11, the substrate processing apparatus 401 includes a spin chuck 402 (substrate holding unit, substrate rotating unit) that horizontally holds and rotates the substrate W, a tubular cup 403 surrounding the spin chuck 402, a rinse liquid nozzle 404 supplying a rinse liquid to an upper surface of the substrate W, a cleaning nozzle 105 (nozzle) making droplets of a processing liquid collide with the upper surface of the substrate W that is covered by a liquid film of a protective liquid, and a controller 108 controlling operations of the spin chuck 402 and other apparatuses and opening/closing of valves provided in the substrate processing apparatus 401. The cleaning nozzle 105 includes an injection nozzle 106 (injection portion, supplying portion) that makes droplets of the processing liquid collide with the upper surface of the substrate W, and a protective liquid nozzle 107 (discharging portion) supplying the protective liquid (cover rinse liquid) to the substrate W. As shown in FIG. 12, the injection nozzle 106 has, for example, a cylindrical shape extending in a vertical direction, and the protective liquid nozzle 107 is disposed along a central axis L13 of the injection nozzle 106. The injection nozzle 106 and the protective liquid nozzle 107 may be an integral nozzle or may be separate nozzles that are coupled together.

As shown in FIG. 11, the spin chuck 402 includes a spin base 109 holding the substrate W horizontally and being rotatable around a vertical rotation axis L11 passing through a center C1 of the substrate W, and a spin motor 110 rotating the spin base 109 around the rotation axis L11. The spin chuck 402 may be a clamping type chuck that holds the substrate W horizontally by clamping the substrate W in a horizontal direction or may be a vacuum type chuck that holds the substrate W horizontally by suctioning of a rear surface (lower surface) of the substrate W that is a non-device-forming surface. A case where the spin chuck 402 is a clamping type chuck is shown in FIG. 11 and FIG. 12.

As shown in FIG. 11, the rinse liquid nozzle 404 is connected to a rinse liquid supply pipe 112 having a rinse liquid valve 111 interposed therein. When the rinse liquid valve 111 is opened, the rinse liquid is discharged toward an upper surface central portion of the substrate W from the rinse liquid nozzle 404. On the other hand, when the rinse liquid valve 111 is closed, the discharge of the rinse liquid from the rinse liquid nozzle 404 is stopped. As examples of the rinse liquid supplied to the rinse liquid nozzle 404, deionized water (deionized water), carbonated water, electrolyzed ion water, hydrogen water, ozone water, or aqueous hydrochloric acid of dilute concentration (for example, approximately 10 to 100 ppm) can be cited.

The injection nozzle 106 is an inkjet nozzle that injects numerous droplets by the inkjet method. As shown in FIG. 11, the injection nozzle 106 is connected via a processing liquid supply pipe 113 to a processing liquid supplying mechanism 114. Further, the injection nozzle 106 is connected to a processing liquid drain pipe 116 in which a drain valve 115 is interposed. The processing liquid supplying mechanism 114 includes, for example, a pump. The processing liquid supplying mechanism 114 constantly supplies the processing liquid at a predetermined pressure (for example, of no more than 10 MPa) to the injection nozzle 106. As examples of the processing liquid supplied to the injection nozzle 106, deionized water, carbonated water, SC-1 (a mixed solution containing $NH_4OH$ and $H_2O_2$) can be cited. By controlling the processing liquid supplying mechanism 114, the controller 108 can change the pressure of the processing liquid supplied to the injection nozzle 106 to any pressure.

Also, as shown in FIG. 11, the injection nozzle 106 includes a piezo element 117 (vibration applying unit) disposed in an interior of the injection nozzle 106. The piezo element 117 is connected to a voltage applying mechanism 119 via a wiring 118. The voltage applying mechanism 119 is, for example, a drive circuit that includes an inverter. The voltage applying mechanism 119 applies an AC voltage to the piezo element 117. When the AC voltage is applied to the piezo element 117, the piezo element 117 vibrates at a frequency corresponding to a frequency of the applied AC voltage. By controlling the voltage applying mechanism 119, the controller 108 can change the frequency of the AC voltage applied to the piezo element 117 to any frequency (for example, from several hundred KHz to several MHz). The frequency of vibration of the piezo element 117 is thus controlled by the controller 108.

As shown in FIG. 11, the substrate processing apparatus 401 further includes a nozzle moving mechanism 120 (relative moving unit). The nozzle moving mechanism 120 includes a nozzle arm 121 holding the cleaning nozzle 105 (injection nozzle 106 and protective liquid nozzle 107), a rotating mechanism 122 connected to the nozzle arm 121, and a raising and lowering mechanism. 123 connected to the rotating mechanism 122. The rotating mechanism 122 includes, for example, a motor. The raising and lowering mechanism 123 includes a ball screw mechanism and a motor that drives the ball screw mechanism. The rotating mechanism 122 rotates the nozzle arm 121 around a vertical rotation axis L12 disposed at a periphery of the spin chuck 402. The cleaning nozzle 105 is rotated around the rotation axis L12 together with the nozzle arm 121. The cleaning nozzle 105 is thereby moved in a horizontal direction. Meanwhile, the raising and lowering mechanism. 123 raises and lowers the rotating mechanism 122 in a vertical direction D11 (reference direction). The cleaning nozzle 105 and the nozzle arm 121 are raised and lowered in the vertical direction D11 together with the rotating mechanism 20. The cleaning nozzle 105 is thereby moved in the vertical direction D11.

The rotating mechanism 122 moves the cleaning nozzle 105 horizontally within a horizontal plane that includes a region above the spin chuck 402. As shown in FIG. 12, the rotating mechanism 122 moves the cleaning nozzle 105 horizontally along a circularly arcuate locus X1 extending along an upper surface of the substrate W held by the spin chuck 402. The locus X1 is a curve that joins two non-overlapping positions on the upper surface of the substrate W when viewed from a perpendicular direction (vertical direction D11) perpendicular to the upper surface of the substrate W held by the spin chuck 402 and passes through the center C1 of the upper surface of the substrate W when viewed from the vertical direction D11. When in a state where the cleaning nozzle 105 is positioned above the substrate W held by the spin chuck 402, the raising and lowering mechanism 123 lowers the cleaning nozzle 105, the cleaning nozzle 105 is moved close to the upper surface of the substrate W. When making the droplets of the processing liquid collide with the substrate W, the controller 108 controls the rotating mechanism 122 to move the cleaning nozzle 105 along the locus X1 in the state where the cleaning nozzle 105 is close to the upper surface of the substrate W.

The protective liquid nozzle 107 is held by the nozzle arm 121. When at least one of either of the rotating mechanism 122 and the raising and lowering mechanism 123 moves the nozzle arm 121, the injection nozzle 106 and the protective liquid nozzle 107 move in a state where a positional relationship of the injection nozzle 106 and the protective liquid nozzle 107 are kept fixed. Thus, when the rotating mechanism 122 rotates the nozzle arm 121, the protective liquid nozzle 107 moves horizontally along the locus X1 together with the injection nozzle 106. As shown in FIG. 11, the protective liquid nozzle 107 is connected to a protective liquid supply pipe 126, having a protective liquid valve 124 and a flow regulating valve 125 interposed therein. When the protective liquid valve 124 is opened, the protective liquid is discharged toward the upper surface of the substrate W from the protective liquid nozzle 107. On the other hand, when the protective liquid valve 124 is closed, the discharge of the protective liquid from the protective liquid nozzle 107 is stopped. A discharge rate of the protective liquid from the protective liquid nozzle 107 is changed by the controller 108 changing an opening degree of the flow regulating valve 125. A rinse liquid or a chemical solution, such as SC-1, can be cited as an example of the protective liquid supplied to the protective liquid nozzle 107.

FIG. 13 is a schematic longitudinal sectional view of the cleaning nozzle 105 according to the fourth preferred embodiment of the present invention. FIG. 14 is a schematic bottom view of the cleaning nozzle 105 according to the fourth preferred embodiment of the present invention.

As mentioned above, the cleaning nozzle 105 includes the injection nozzle 106 that makes the droplets of the processing liquid collide with the upper surface of the substrate W and the protective liquid nozzle 107 that supplies the protective liquid to the substrate W. As shown in FIG. 13, the injection nozzle 106 has, for example, the cylindrical shape extending in the vertical direction, and the protective liquid nozzle 107 is disposed along the central axis L13 of the injection nozzle 106 (central axis L13 of the cleaning nozzle 105). An outer diameter of the injection nozzle 106 is smaller than a diameter of the substrate W. The injection nozzle 106 and the protective liquid nozzle 107 are coupled by a stay (not shown in Figures.)

As shown in FIG. 13, the injection nozzle 106 includes a main body 127 with a cylindrical shape extending in the vertical direction and the piezo element 117 disposed in an interior of the main body 127. An end portion of the wiring 118 is connected to the piezo element 117 in the interior of the main body 127. The main body 127 is formed of a chemical-resistant material with chemical resistance. The main body 127 is formed, for example, of quartz. The main body 127 has a strength capable of withstanding a high pressure.

As shown in FIG. 13, the main body 127 includes a supply port 128 supplied with the processing liquid, a drain port 129 from which the processing liquid supplied to the supply port 128 is drained, a processing liquid flow passageway 130 connecting the supply port 128 and the drain port 129, and a plurality of injection ports 131 (annularly aligned injection ports) connected to the processing liquid flow passageway 130. The processing liquid flow passageway 130 includes an upstream passage 132 connected to the supply port 128, a downstream passage 133 connected to the drain port 129, two branch passages 134 connecting the upstream passage 132 and the downstream passage 133, and a plurality of connection passages 135 connected to the branch passages 134. The upstream passage 132 and the downstream passage 133 extend in the vertical direction D11, and the branch passages 134 extend horizontally from a lower end of the upstream passage 132 to a lower end of the downstream passage 133. As shown in FIG. 14, the two branch passages 134 are disposed along a circle C having a center X (reference point) on the central axis L13 of the injection nozzle 106. As shown in FIG. 13, the plurality of connection passages 135 respectively extend downward from each branch passage 134. The plurality of injection ports 131 are connected respectively to the plurality of connection passages 135. The injection ports 131 are thus connected to the processing liquid downstream passage 133 via the connection passages 135. Flow passage areas of the injection port 131 and the connection passage 135 are smaller than a flow passage area of the branch passage 134.

The injection ports 131 are microscopic pores with a diameter, for example, of several μm to several dozen μm. As shown in FIG. 13, a lower surface 127a of the main body 127 is, for example, a flat surface and the plurality of injection ports 131 open at the lower surface 127a of the main body 127. The plurality of injection ports 131 are thus disposed at the same height. Further, as shown in FIG. 14, the plurality of injection ports 131 are aligned at equal intervals along the horizontal circle C with the center X on the central axis L13 of the injection nozzle 106 (central axis L13 of the cleaning nozzle 105). A discharge port 136 (central discharge port) of the protective liquid nozzle 107 is disposed on the vertical axis (central axis L13 of the injection nozzle 106) passing through the center X. The discharge port 136 is thus surrounded across a whole circumference by the plurality of injection ports 131. Distances (minimum distances) from the respective injection ports 131 to the discharge port 136 are equal. The discharge port 136 may be disposed at the same height as the plurality of injection ports 131 or may be disposed at a different height from the plurality of injection ports 131. The discharge port 136 is, for example, a circular opening. The protective liquid nozzle 107 discharges the protective liquid vertically downward from the discharge port 136. Likewise, the injection nozzle 106 injects droplets vertically downward from the respective injection ports 131. The injection nozzle 106 and the protective liquid nozzle 107 thus discharge liquids in mutually parallel directions.

As shown in FIG. 13, the processing liquid supply pipe 113 and the processing liquid drain pipe 116 are connected respectively to the supply port 128 and the drain port 129. The processing liquid supplying mechanism 114 (see FIG. 11) is thus connected to the supply port 128 via the processing liquid supply pipe 113. The processing liquid supplying mechanism 114 constantly supplies the processing liquid at a high pressure to the injection nozzle 106. The processing liquid supplied to the supply port 128 from the processing liquid supplying mechanism 114 is supplied to the processing liquid flow passageway 130. In a state where the drain valve 115 is closed, a pressure (liquid pressure) of the processing liquid in the processing liquid flow passageway 130 is high. Thus, in this state, the processing liquid is injected from the respective injection ports 131 due to the liquid pressure. Further, when the AC voltage is applied to the piezo element 117 in this state, the processing liquid flowing through the processing liquid flow passageway 130 is severed by the vibration from the piezo element 117, and a liquid column of the processing liquid having a diameter substantially equal to the diameter of each injection port 131 is injected from the injection port 131. The liquid column changes to a spherical shape due to surface tension. Spherical droplets having a diameter (for example, of 15 μm to 200 μm) that is greater than the diameter of the injection port 131 thus fly toward the substrate W.

On the other hand, when the drain valve 115 is open, the processing liquid supplied to the processing liquid flow passageway 130 is drained from the drain port 129 to the processing liquid drain pipe 116. That is, in the state where the drain valve 115 is open, the liquid pressure in the processing liquid flow passageway 130 is not raised adequately. The injection ports 131 are microscopic pores and thus to make the processing liquid be injected from the injection ports 131, the liquid pressure in the processing liquid flow passageway 130 is required to be raised to no less than a predetermined value. However, in the state where the drain valve 115 is open, the liquid pressure in the processing liquid flow passageway 130 is a low pressure and thus the processing liquid in the processing liquid flow passageway 130 is drained to the processing liquid drain pipe 116 from the drain port 129 without being injected from the injection ports 131. The injecting of the processing liquid from the injection ports 131 is thus controlled by the opening and closing of the drain valve 115. The controller 108 (see FIG. 11) opens the drain valve 115 while the cleaning nozzle 105 is not used for processing the substrate W (during standby of the cleaning nozzle 105). A state where the processing liquid flows through the interior of the injection nozzle 106 is thus maintained even during standby of the cleaning nozzle 105.

In making the droplets of the processing liquid collide with the upper surface of the substrate W, the controller 108 makes the nozzle moving mechanism 120 (see FIG. 11) move the cleaning nozzle 105 to thereby make the lower surface (lower surface 127a of the main body 127) of the injection nozzle 106 approach the upper surface of the substrate W. Then, in the state where the plurality of injection ports 131 provided in the injection nozzle 106 and the discharge port 136 provided in the protective liquid nozzle 107 face the upper surface of the substrate W, the controller 108 opens the protective liquid valve 124 to make the protective liquid be discharged from the discharge port 136. Further, in this state, the controller 108 closes the drain valve 115 to raise the pressure inside the processing liquid flow passageway 130 and drives the piezo element 117 to apply vibration to the processing liquid inside the processing liquid flow passageway 130. Numerous processing liquid droplets of uniform particle diameter are thereby injected at the same time at a uniform speed. Specifically, uniform droplets with which variations of the particle diameter and speed with respect to average values are within 10% are injected toward the upper surface of the substrate W.

As shown in FIG. 13, the droplets of the processing liquid are injected from the plurality of injection ports 131 respectively to the plurality of collision positions P1 within the upper surface of the substrate W. Also, the protective liquid is discharged toward the liquid contact position P2 within the upper surface of the substrate W from the discharge port 136. A positional relationship of the collision positions P1 and the liquid contact position P2 is the same as the positional relationship of the injection ports 131 and the discharge port 136 when the injection ports 131 and the discharge port 136 are viewed from the vertical direction D11. As mentioned above, the distances from the respective injection ports 131 to the discharge port 136 are equal. Distances D (minimum distances) from the respective collision positions P1 to the liquid contact position P2 are thus equal.

FIG. 15A to FIG. 15D are diagrams for describing an example of processing of a substrate W performed by the substrate processing apparatus 401 according to the fourth preferred embodiment of the present invention. FIG. 11 and FIG. 12 shall be referenced in the following description. FIG. 15A to FIG. 15D shall be referenced where suitable.

An unprocessed substrate W is conveyed by a conveying robot (not shown in Figures) and placed on the spin chuck 402 with, for example, a top surface, which is a device-forming surface, faced upward. The controller 108 then makes spin chuck 402 hold the substrate W. Thereafter, the controller 108 controls the spin motor 110 to rotate the substrate W held by the spin chuck 402.

Thereafter, a first covering process of supplying deionized water, which is an example of a rinse liquid, from the rinse liquid nozzle 404 to the substrate W and covering the upper surface of the substrate W with deionized water is performed. Specifically, while making the spin chuck 402 rotate the substrate W, the controller 108 opens the rinse liquid valve 111 to make deionized water be discharged from the rinse liquid nozzle 404 onto the upper surface central portion of the substrate W held by the spin chuck 402 as shown in FIG. 15A. The deionized water discharged from the rinse liquid nozzle 404 is supplied to the upper surface central portion of the substrate W and spreads outward along the upper surface of the substrate W upon receiving the centrifugal force due to the rotation of the substrate W. The deionized water is thereby supplied to the entire upper surface of the substrate W and a liquid film of deionized water that covers the entire upper surface of the substrate W is formed. Then, after elapse of a predetermined time from the opening of the rinse liquid valve 111, the controller 108 closes the rinse liquid valve 111 and stops the discharging of deionized water from the rinse liquid nozzle 404.

Thereafter, a cleaning process of cleaning the substrate W by supplying droplets of carbonated water, which is an example of the processing liquid, from the injection nozzle 106 to the substrate W and a second covering process of covering the upper surface of the substrate W with SC-1, which is an example of the protective liquid, by supplying SC-1 from the protective liquid nozzle 107 to the substrate W are performed in parallel. Specifically, the controller 108 controls the nozzle moving mechanism 120 to move the cleaning nozzle 105 (injection nozzle 106 and protective liquid nozzle 107) to above the spin chuck 402 and bring the lower surface (lower surface 127a of the main body 127) of the cleaning nozzle 105 close to the upper surface of the substrate W. Thereafter, while making the spin chuck 402 rotate the substrate W, the controller 108 opens the protective liquid valve 124 to make SC-1 be discharged from the protective liquid nozzle 107 as shown in FIG. 15B. A liquid film of SC-1 that covers the upper surface of the substrate W is thereby formed.

In parallel to the discharging of SC-1 from the protective liquid nozzle 107, the controller 108 makes droplets of carbonated water be injected from the injection nozzle 106. Specifically, in the state where the lower surface of the cleaning nozzle 105 is close to the upper surface of the substrate W and SC-1 is being discharged from the protective liquid nozzle 107, the controller 108 closes the drain valve 115 and makes the voltage applying mechanism 119 apply the AC voltage of the predetermined frequency to the piezo element 117. Further, while making the substrate W rotate at a fixed rotation speed, the controller 108 makes the nozzle moving mechanism 120 move the cleaning nozzle 105 reciprocatingly along the locus X1. A plurality of droplets are thereby injected from the injection nozzle 106 as shown in FIG. 15B and these droplets collide with the upper surface of the substrate W that is covered by the liquid film of SC-1. After the injecting of the droplets has been performed for a predetermined time, the controller 108 opens the drain valve 115 to stop the injecting of droplets from the injection nozzle 106. Further, the controller 108 closes the protective liquid valve 124 to stop the discharge of SC-1 from the protective liquid nozzle 107. Thereafter, the controller 108 makes the nozzle moving mechanism 120 withdraw the cleaning nozzle 105 from above the substrate W.

In the cleaning process, the controller 108 may perform a full scan of making the cleaning nozzle 105 move along the locus X1 from a peripheral edge position Pe1 (see FIG. 15B) at which the cleaning nozzle 105 faces an upper surface peripheral edge portion of the substrate W to a peripheral edge position Pe2 (see FIG. 15B) at which the cleaning nozzle 105 faces the upper surface peripheral edge portion of the substrate W, or may perform a half scan of making the cleaning nozzle 105 move along the locus X1 from a central position Pc (see FIG. 15B) at which the cleaning nozzle 105 faces the upper surface central portion of the substrate W to the peripheral edge position Pe1. In either case, where the full scan or the half scan is performed, the controller 108 may move the cleaning nozzle 105 in a state where a distance between the cleaning nozzle 105 and the substrate W in the vertical direction D11 is maintained to be fixed or may move the cleaning nozzle 105 while changing the distance between the cleaning nozzle 105 and the substrate W. For example, as shown in FIG. 15B, the cleaning nozzle 105 may be moved so that the distance between the cleaning nozzle 105 and the substrate W at each of the peripheral edge position Pe1 and the peripheral edge position Pe2 is shorter than the distance between the cleaning nozzle 105 and the substrate W at the central position Pc.

By the numerous droplets of carbonated water being injected downward from the injection nozzle 106, the numerous droplets of carbonated water are injected onto the upper surface of the substrate W covered by the liquid film of SC-1. Also, in either case where the full scan or the half scan is performed, the cleaning nozzle 105 passes through the central position Pc and the peripheral edge position Pe1 so that the entire upper surface of the substrate W is scanned by droplets of carbonated water and the droplets of carbonated water collide with the entire upper surface of the substrate W. Particles and other foreign matter attached to the upper surface of the substrate W are thus physically removed by collision of the droplets with the substrate W. Also, a binding force of a foreign matter with respect to the substrate W is weakened by dissolution of the substrate W by SC-1. The foreign matter is thus removed more reliably. Moreover, reattachment of foreign matter to the substrate W is suppressed or prevented because the droplets of carbonated water are injected onto the upper surface of the substrate W in the state where the entire upper surface of the substrate W is covered by the liquid film. The cleaning process is thus performed in parallel with the second covering process.

Thereafter, a rinsing process of supplying deionized water, which is an example of the rinse liquid, from the rinse liquid nozzle 404 to the substrate W is performed to rinse off liquid and foreign matter attached to the substrate W. Specifically, while making the spin chuck 402 rotate the substrate W, the controller 108 opens the rinse liquid valve 111 to make deionized water be discharged from the rinse liquid nozzle 404 onto the upper surface central portion of the substrate W held by the spin chuck 402 as shown in FIG. 15C. The deionized water discharged from the rinse liquid nozzle 404 is supplied to the upper surface central portion of the substrate W and spreads outward along the upper surface of the substrate W upon receiving the centrifugal force due to the rotation of the substrate W. Deionized water is thereby supplied to the entire upper surface of the substrate W and the liquid and foreign matter attached to the substrate W are rinsed off. After elapse of a predetermined time from the opening of the rinse liquid valve 111, the controller 108 closes the rinse liquid valve 111 and stops the discharging of deionized water from the rinse liquid nozzle 404.

Thereafter, a drying process (spin drying) of drying the substrate W is performed. Specifically, the controller 108 controls the spin motor 110 to rotate the substrate W at a high rotation speed (for example, several thousand rpm). A large centrifugal force is thereby made to act on the deionized water attached to the substrate W and the deionized water attached to the substrate W is spun off to a periphery of the substrate W as shown in FIG. 15D. The deionized water is thereby removed from the substrate W and the substrate W dries. After the drying process has been performed for a predetermined time, the controller 108 controls the spin motor 110 to stop the rotation of the substrate W by the spin chuck 402. Thereafter, the processed substrate W is conveyed out from the spin chuck 402 by the conveying robot.

As described above, with the present preferred embodiment, the liquid film of the protective liquid that covers the substrate W is formed by the protective liquid being discharged from the discharge port 136. By the plurality of droplets then being injected from the plurality of injection ports 131, the plurality of droplets collide with the substrate W covered by the liquid film of the protective liquid. The droplets injected from the respective injection ports 131 collide with the collision positions P1 within the substrate W that are equal in the distance D from the liquid contact position P2 within the substrate W at which the protective liquid makes contact. The thickness of the liquid film of the protective liquid on the substrate W changes in accordance with distance from the liquid contact position P2. Thus, by equalizing the distances from the respective collision positions P1 to the liquid contact position P2, variation of film thickness (thickness of the liquid film of the protective liquid) among the respective collision positions P1 can be reduced. Variation of impact applied to the substrate W at the respective collision positions P1 can thus be reduced. Further, the particle diameter and the speed of the droplets injected toward the substrate W are uniform and thus droplets having a uniform kinetic energy collide with the substrate W. The variation of impact applied to the substrate W due to collision of the droplets can thereby be reduced further. Uniformity of processing can thus be improved.

In regard to the fourth preferred embodiment, the following changes are possible.

Figure 16A:
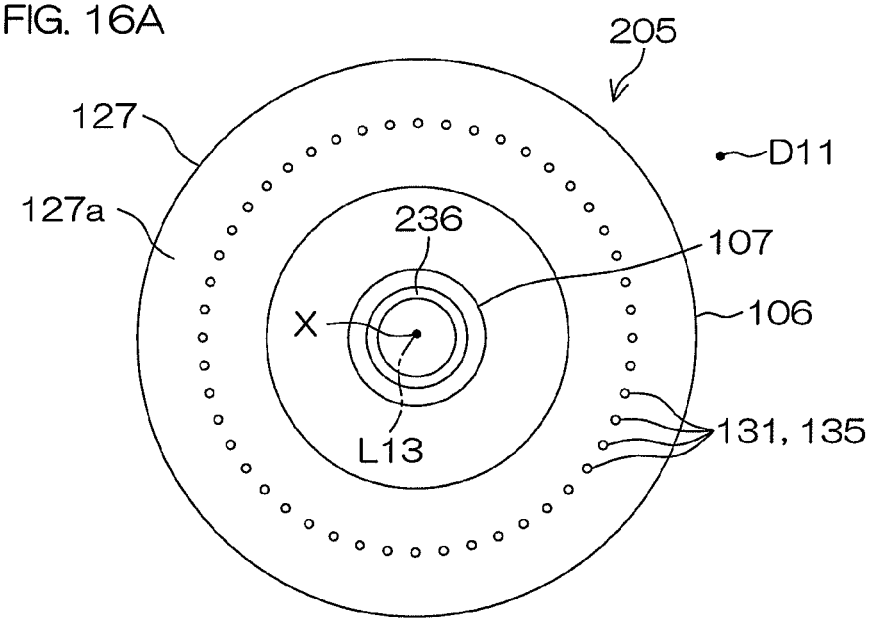
FIG. 16A is a schematic bottom view of a cleaning nozzle according to a fifth preferred embodiment of the present invention.
Figure 16B:
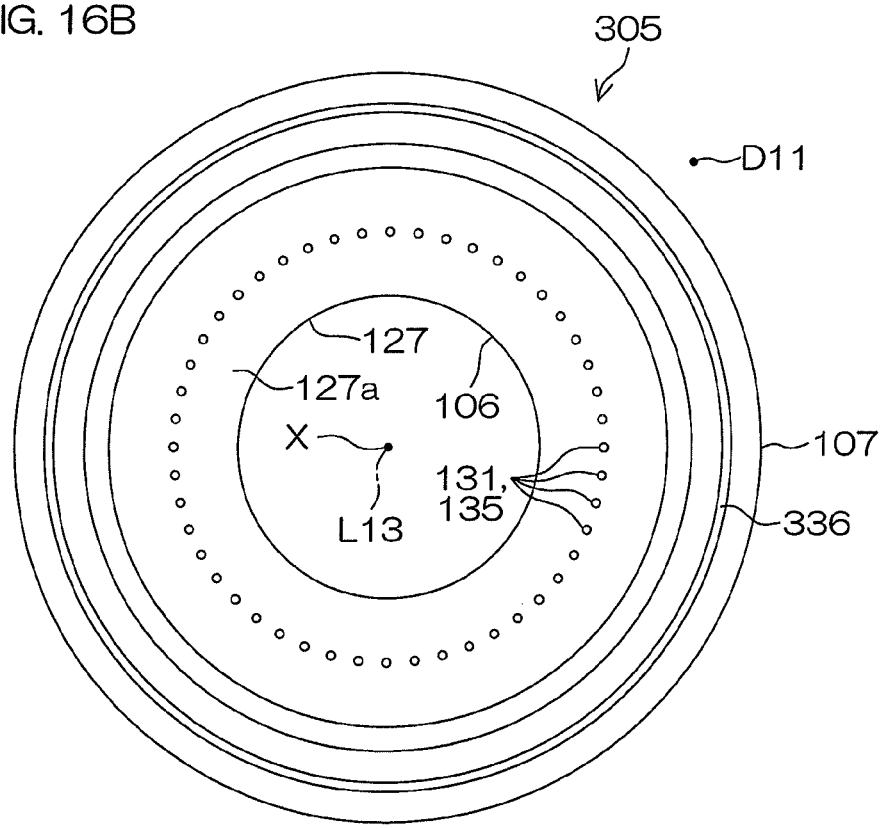
FIG. 16B is a schematic bottom view of a cleaning nozzle according to a sixth preferred embodiment of the present invention.

For example, with the preferred embodiment described above, a case where the discharge port 136 of the protective liquid is circular and is disposed on the central axis L13 of the cleaning nozzle 105 when viewed from the vertical direction D11 has been described. However, as in fifth and sixth preferred embodiments respectively shown in FIG. 16A and FIG. 16B, the discharge port 136 of the protective liquid may be of an annular form that is continuous along a whole circumference and may be disposed so as to coaxially surround the central axis L13 of the cleaning nozzle 105 when viewed from the vertical direction D11. In this case, the discharge port may be disposed at an inner side of a plurality of injection ports 131 in the manner of an inner discharge port 236 (annular discharge port) of a cleaning nozzle 205 shown in FIG. 16A or may be disposed at an outer side of the plurality of injection ports 131 in the manner of an outer discharge port 336 (annular discharge port) of a cleaning nozzle 305 shown in FIG. 16B.

Figure 16C:
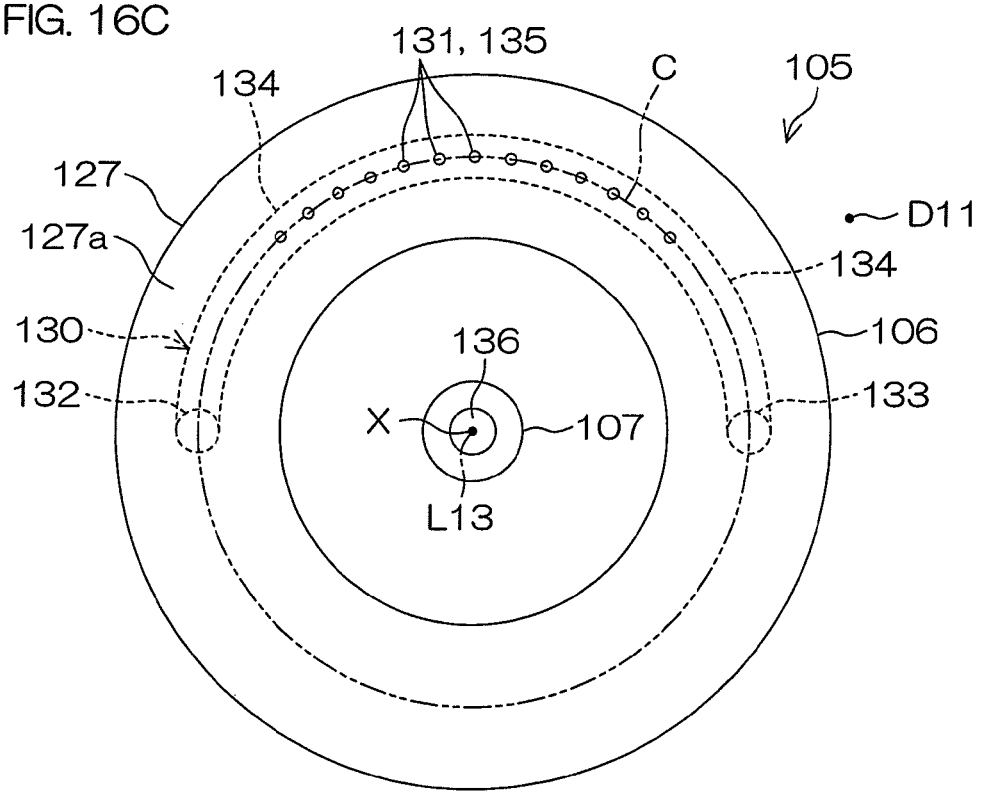
FIG. 16C is a schematic bottom view of a cleaning nozzle according to a seventh preferred embodiment of the present invention.
Figure 16D:
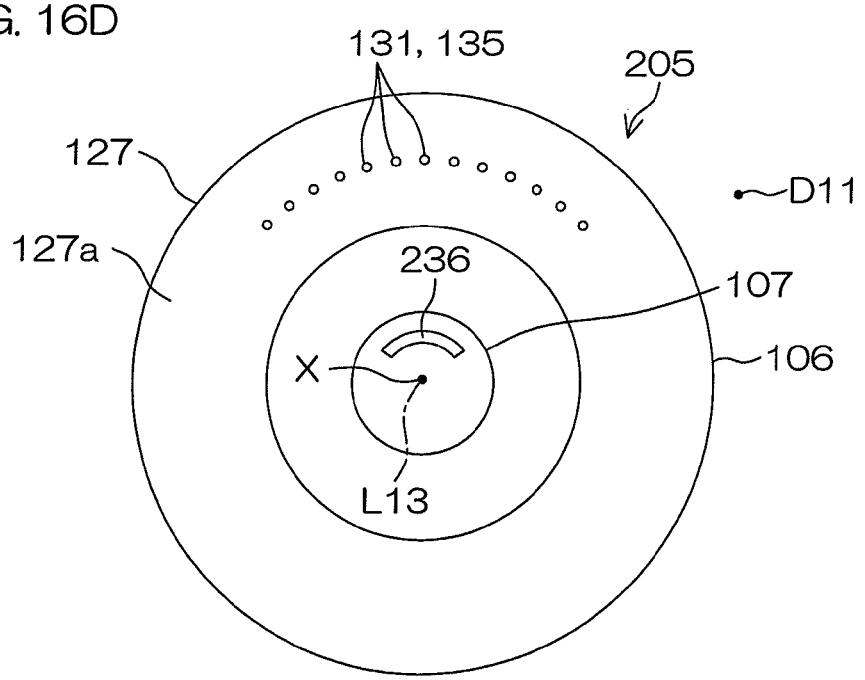
FIG. 16D is a schematic bottom view of a cleaning nozzle according to an eighth preferred embodiment of the present invention.
Figure 16E:
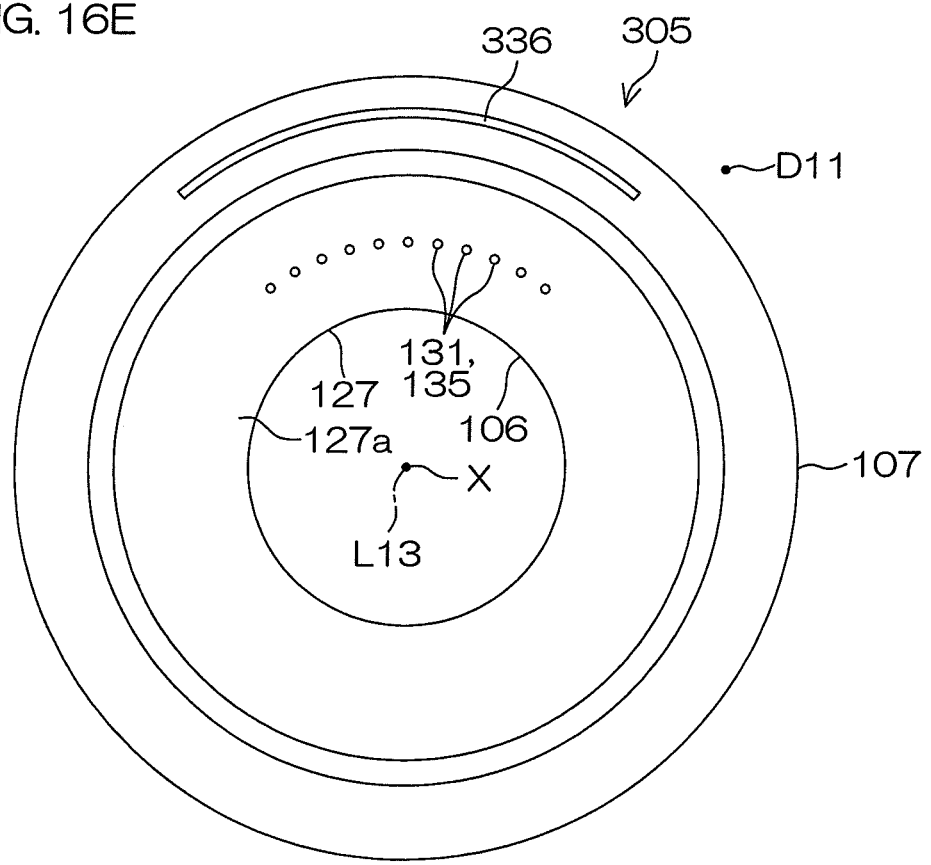
FIG. 16E is a schematic bottom view of a cleaning nozzle according to a ninth preferred embodiment of the present invention.

Also, with the preferred embodiment, a case where the plurality of injection ports 131 are disposed along the horizontal circle C having the center X on the central axis L13 of the cleaning nozzle 105 has been described. However, the plurality of injection ports 131 may instead be disposed along a horizontal circular arc centered on the central axis L13 of the cleaning nozzle 105 as in a seventh preferred embodiment shown in FIG. 16C. That is, the plurality of injection ports 131 do not have to surround the discharge port 136 across a whole circumference. In the case where the plurality of injection ports 131 are disposed in a circularly arcuate form, the inner discharge port 236 or the outer discharge port 336 may also be an inner arcuate discharge port or an outer arcuate discharge port formed to corresponding circularly arcuate shapes that are not continuous across a whole circumference. Such arrangements are shown respectively in FIG. 16D (eighth preferred embodiment) and FIG. 16E (ninth preferred embodiment).

Figure 17A:
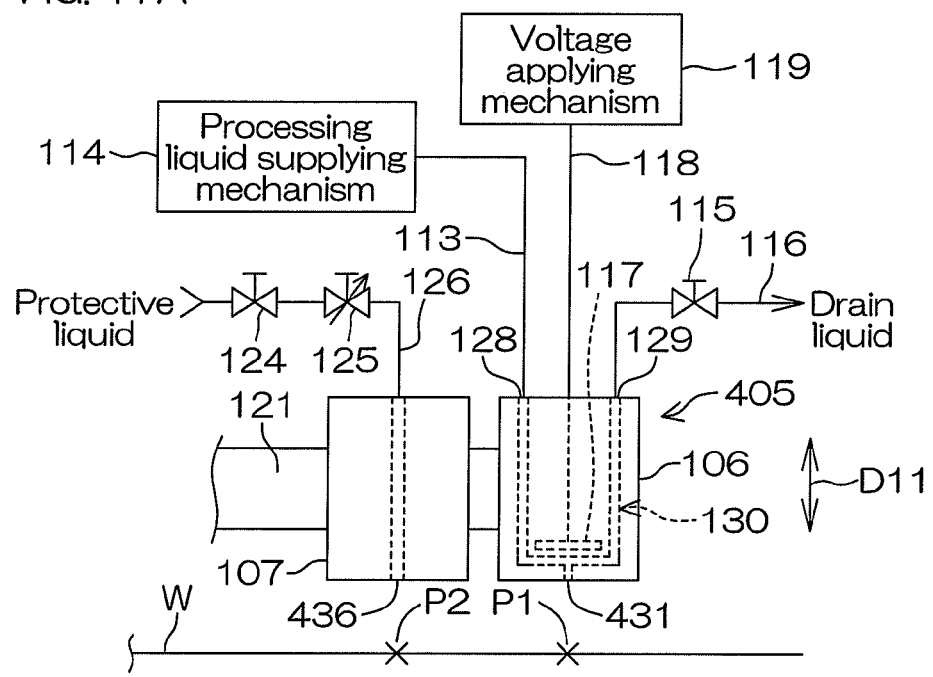
FIG. 17A is a schematic side view of a cleaning nozzle according to a tenth preferred embodiment of the present invention.
Figure 17B:
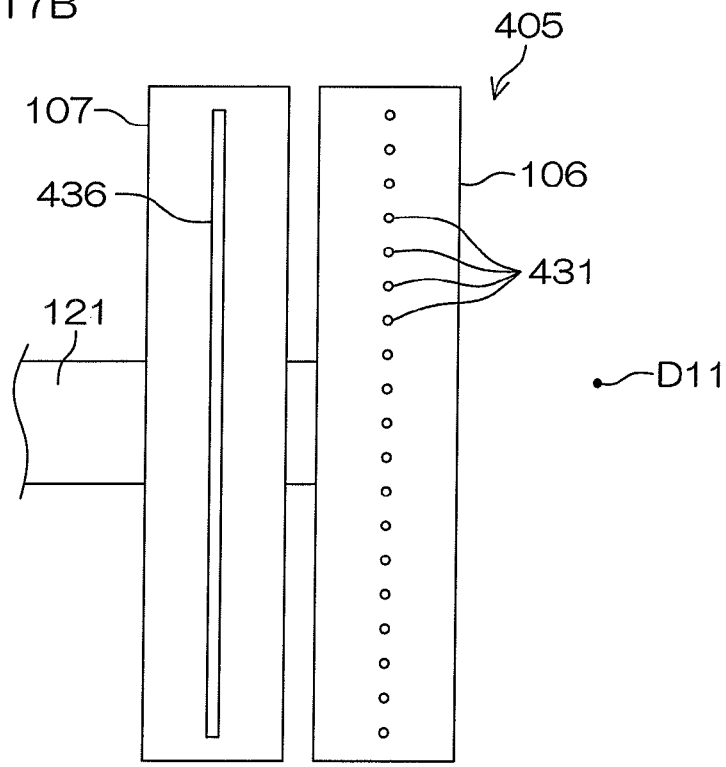
FIG. 17B is a schematic bottom view of the cleaning nozzle according to the tenth preferred embodiment of the present invention.

Also, with the preferred embodiment, a case where the plurality of injection ports 131 are aligned annularly has been described. However, the plurality of injection ports 131 may instead be aligned rectilinearly. Specifically, as in a cleaning nozzle 405 according to a tenth preferred embodiment shown in FIG. 17A and FIG. 17B, a plurality of injection ports 431 (rectilinearly aligned injection ports) may be aligned rectilinearly at equal intervals and a discharge port 436 (rectilinear discharge port) may take the form of a slit parallel to the plurality of injection ports 431.

A length (length in a longitudinal direction) of the discharge port 436 is equal to a length from one end to another end of the plurality of injection ports 431. In this case, a direction of discharge of the protective liquid from the discharge port 436 does not have to be parallel to a direction of injection of droplets from the injection ports 431.

Also, with the preferred embodiment, a case where the plurality of injection ports 131 are disposed at the same height has been described. However, the plurality of injection ports 131 may instead be disposed respectively at different heights. That is, it suffices that the plurality of injection ports 131 be disposed at positions of equal distance from the central axis L13 of the cleaning nozzle 105 when viewed from the vertical direction D11.

Also, with the preferred embodiment, a case where the cleaning nozzle 105 includes an inkjet nozzle (injection nozzle 106) that injects numerous droplets by the inkjet method has been described. However, the cleaning nozzle 105 may include a two-fluid nozzle that forms droplets by collision of a liquid and a gas. For example, a cleaning liquid nozzle 105 may include a plurality of two-fluid nozzles disposed annularly and a protective liquid nozzle 107 disposed at a center of the plurality of two-fluid nozzles.

Also, although with the preferred embodiment, a case where the substrate W is processed using a single cleaning nozzle 105 has been described, the substrate W may be processed using a plurality of cleaning nozzles 105. That is, a plurality of cleaning nozzles 105 corresponding to a spin chuck 402 in common may be provided.

Also, although with the preferred embodiment, a case where the substrate processing apparatus 401 is an apparatus that processes the circular substrate W has been described, the substrate processing apparatus 401 may be an apparatus that processes a polygonal substrate, such as a substrate for liquid crystal display.

Although the preferred embodiments of the present invention have been described in detail, these embodiments are merely specific examples used to clarify the technical contents of the present invention, and the present invention should not be understood as being limited to these specific examples, and the spirit and scope of the present invention are limited solely by the appended claims.

The present application corresponds to Japanese Patent Application No. 2011-187687 filed in the Japan Patent Office on Aug. 30, 2011 and Japanese Patent Application No. 2011-214935 filed in the Japan Patent Office on Sep. 29, 2011, and the entire disclosures of these applications are incorporated herein by reference.

What is claimed is:
1. A substrate processing apparatus comprising:
a spin chuck that holds and rotates a substrate;
a nozzle for making droplets injected from a plurality of injection ports collide with the substrate covered by a liquid film of a protective liquid discharged from a discharge port, the nozzle including an injection portion and a discharge portion;
a processing liquid supply pipe that supplies a processing liquid to the injection portion; and
a protective liquid supply pipe that supplies the protective liquid to the discharge portion;
a controller configured and programmed to perform a processing liquid supply control and a protective liquid supply control;
the nozzle including
the injection portion in which the plurality of injection ports are formed so that the droplets injected from the plurality of injection ports collide respectively with a plurality of collision positions on the substrate;

the discharge portion in which the discharge port is formed so that the protective liquid contacts a liquid contact position on the substrate that is equal in distance from the respective collision positions;

a supplying portion in which a processing liquid flow passageway supplying the processing liquid to the plurality of injection ports is formed; and a vibrator that is configured to sever the processing liquid supplied to the plurality of injection ports by applying vibration to the processing liquid flowing through the processing liquid flow passageway, thereby causing each of the injection ports to inject the droplets formed by the severed processing liquid;

the controller being configured and programmed to perform the processing liquid supply control to supply the processing liquid through the processing liquid supply pipe so as to inject the droplets from the plurality of injection ports, and to perform the protective liquid supply control to supply the protective liquid through the protective liquid supply pipe so as to discharge the protective liquid from the discharge port simultaneously with the droplet injection from the injection ports.

2. The substrate processing apparatus according to claim 1, wherein distances from the respective injection ports to the discharge port are equal.

3. The substrate processing apparatus according to claim 1, wherein the plurality of injection ports include: a plurality of annularly aligned injection ports disposed at positions of equal distance from a reference point when viewed from a reference direction; and the discharge port includes: a central discharge port disposed so as to be positioned at the reference point when viewed from the reference direction.

4. The substrate processing apparatus according to claim 1, wherein the plurality of injection ports include: a plurality of arcuately aligned injection ports disposed at positions of equal distance from a reference point when viewed from a reference direction; and the discharge port includes: an arcuate discharge port that is continuous in a circumferential direction of an arc centered at the reference point when viewed from the reference direction.

5. The substrate processing apparatus according to claim 1, wherein the plurality of injection ports include: a plurality of annularly aligned injection ports disposed at positions of equal distance from a reference point when viewed from a reference direction; and the discharge port includes: an annular discharge port disposed so as to surround the reference point when viewed from the reference direction and being continuous across a whole circumference.

6. The substrate processing apparatus according to claim 1, wherein the plurality of injection ports include: a plurality of rectilinearly aligned injection ports disposed so as to be aligned rectilinearly when viewed from a reference direction; and the discharge port includes: a slit-shaped rectilinear discharge port parallel to the plurality of rectilinearly aligned injection ports when viewed from the reference direction.

7. The substrate processing apparatus according to claim 1, further comprising:

a relative movement arm that makes the nozzle and the substrate held by the spin chuck move relatively by moving at least one of either the nozzle or the substrate in a state where a positional relationship of the plurality of injection ports and the discharge port is kept fixed.

8. The substrate processing apparatus according to claim 7, wherein the spin chuck rotates the substrate around a rotation axis intersecting a central portion of a principal surface of the substrate held by the spin chuck;

wherein the relative movement arm moves the nozzle between a central position at which the nozzle faces the central portion of the principal surface of the substrate and a peripheral edge position at which the nozzle faces a peripheral edge portion of the principal surface of the substrate in a manner such that a distance between the nozzle and the substrate at the central position is shorter than a distance between the nozzle and the substrate at the peripheral edge position.

9. The substrate processing apparatus according to claim 1, wherein the vibrator is a piezo element.

* * * * *